United States Patent
Su

(10) Patent No.: US 9,608,048 B2
(45) Date of Patent: Mar. 28, 2017

(54) TOUCH DISPLAY DEVICE AND METHOD FOR MANUFACTURING THE SAME

(71) Applicants: Shanghai Tianma AM-OLED Co., Ltd., Shanghai (CN); Tianma Micro-Electronics Co., Ltd., Shenzhen (CN)

(72) Inventor: Congyi Su, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 89 days.

(21) Appl. No.: 14/537,880

(22) Filed: Nov. 10, 2014

(65) Prior Publication Data

US 2015/0380467 A1    Dec. 31, 2015

(30) Foreign Application Priority Data

Jun. 30, 2014   (CN) .......................... 2014 1 0309292

(51) Int. Cl.
  *H01L 27/32*   (2006.01)
  *G06F 3/047*   (2006.01)

(52) U.S. Cl.
  CPC ........ *H01L 27/323* (2013.01); *H01L 27/3246* (2013.01); *G06F 3/047* (2013.01)

(58) Field of Classification Search
  CPC combination set(s) only.
  See application file for complete search history.

(56) References Cited

U.S. PATENT DOCUMENTS

| 6,885,157 B1 | 4/2005 | Cok et al. |
| 7,936,121 B2 | 5/2011 | Kim |
| 2010/0194710 A1* | 8/2010 | Koito ...................... G06F 3/047 345/174 |
| 2014/0133046 A1* | 5/2014 | Sung ..................... G02F 1/1335 359/893 |

FOREIGN PATENT DOCUMENTS

| CN | 101339314 A | 1/2009 |
| CN | 101610633 A | 12/2009 |
| CN | 103293736 A | 9/2013 |
| CN | 103455189 A | 12/2013 |

* cited by examiner

*Primary Examiner* — Kyoung Lee
*Assistant Examiner* — Ratisha Mehta
(74) *Attorney, Agent, or Firm* — Anova Law Group, PLLC

(57) ABSTRACT

A touch display device and a method for manufacturing the same are provided. The touch display device includes a first substrate, a second substrate disposed opposite to the first substrate, and at least one touch signal transmission unit. The touch signal transmission unit includes: a first conductive layer located above a side of the first substrate facing the second substrate; a second conductive layer located above a side of the second substrate facing the first substrate; a touch signal transmission layer, located between the second conductive layer and the second substrate and electrically connected to the first conductive layer via the second conductive layer; and a spacer located between the first substrate and the second substrate, where a vertical projection of the spacer onto the first substrate at least partially overlaps vertical projections of the first conductive layer and the second conductive layer onto the first substrate.

8 Claims, 21 Drawing Sheets

TOUCH DISPLAY DEVICE AND METHOD FOR MANUFACTURING THE SAME

CROSS-REFERENCES TO RELATED APPLICATIONS

This application claims the benefit of priority to Chinese Patent Application No. 201410309292.7, filed with the Chinese Patent Office on Jun. 30, 2014 and entitled "TOUCH DISPLAY DEVICE AND METHOD FOR MANUFACTURING THE SAME", the content of which is incorporated herein by reference in its entirety.

FIELD

The disclosure relates to touch control technologies, and in particular to a touch display device and a method for manufacturing the same.

BACKGROUND OF THE INVENTION

With the rapid development of display technology, touch screen panels have become popular in people's life. At present, a conventional in-cell capacitive touch display is achieved by adding touch scanning lines and touch sensing lines on a conventional Thin Film Transistor (TFT) array substrate. That is, two layers of strip electrodes are formed on a surface of the TFT array substrate, the strip electrodes in one layer intersecting with the strip electrodes in the other layer. The strip electrodes in one layer and the strip electrodes in the other layer respectively serve as the touch driving lines and the touch sensing lines of the touch display, and mutual capacitances are formed at positions where the strip electrodes in one layer intersect the strip electrodes in the other layer. An operation procedure of the above conventional capacitive touch display is given as follows. When touch driving signals are applied to electrodes serving as touch driving lines, voltage signals in the touch sensing lines generated through the mutual capacitances may be detected. Here, if the touch screen is in contact with a human body, an electric field of the human body may affect the mutual capacitances and change the capacitance value of the mutual capacitances; hence, the voltage signals in the touch sensing lines generated through the mutual capacitances are changed. A touch position may be determined based on variations of the voltage signals. Conventional, two schemes are generally adapted to transmit a touch signal. In a first scheme, conductive golden balls are provided between an upper substrate and a lower substrate as a medium for transmitting the signal between the upper substrate and the lower substrate. In the case that a touch occurs in a display region, the touch signal is transmitted from the touch position to a periphery region, and then the touch signal is transmitted to the lower substrate via the conductive golden balls. In a second scheme, a set of Flexible Printed Circuits (FPCs) are additionally provided for the touch substrate. The FPCs may independently identify the touch signal.

With the progress of technology and the increased requirements of customers, many disadvantages of the above structure of the touch display device are obvious. Specifically, for the first scheme, the process capability of the conductive golden ball is poor, and there are many problems, for example, in coating the golden balls and in metallic contact between the golden balls and the substrates, thereby affecting product yield. Furthermore, in the case that the conductive golden balls are used as the medium for transmitting the signal between the upper substrate and the lower substrate, borders of the touch display device may not be narrowed due to poor alignment accuracy. Additionally, a distance between the upper substrate and the lower substrate may not be reduced due to the usage of the conductive golden balls. The second scheme may inevitably increase the cost due to the addition of the FPCs.

BRIEF SUMMARY OF THE INVENTION

In view of the disadvantages of conventional technologies, a touch display device and a method for manufacturing the same are provided in the disclosure.

Embodiments of the present invention provide a touch display device. The touch display device includes a first substrate; a second substrate disposed opposite to the first substrate; and at least one touch signal transmission unit.

In one embodiment, the at least one touch signal transmission unit includes:

a first conductive layer located above a side of the first substrate facing the second substrate;

a second conductive layer located above a side of the second substrate facing the first substrate;

a touch signal transmission layer located between the second conductive layer and the second substrate and electrically connected to the first conductive layer via the second conductive layer; and a spacer located between the first substrate and the second substrate, where a vertical projection of the spacer onto the first substrate at least partially overlaps a vertical projection of the first conductive layer onto the first substrate and a vertical projection of the second conductive layer onto the first substrate.

Embodiments of the present invention provide a method for manufacturing the touch display device as described above. The method includes:

providing a first substrate and a second substrate;

forming a touch signal transmission layer on the second substrate;

forming a spacer above the first substrate or the second substrate;

forming a first conductive layer on the first substrate;

forming a second conductive layer on the second substrate; and forming a touch signal transmission unit from the first conductive layer and the second conductive layer together.

With the touch display device and the method for manufacturing the same provided in the disclosure, signal transmissions between an upper substrate and a lower substrate are achieved, and simplified fabrication process, improved yield, narrowed borders of the display and reduced thickness of the display are achieved.

BRIEF DESCRIPTION OF THE DRAWINGS

To clarify technical solutions according to embodiments of the disclosure, drawings to be used in the following descriptions of the embodiments are briefly introduced. Apparently, those drawings are merely exemplary, and other drawings may be obtained by the ordinary skilled in the art based on the drawings without creative work.

DETAILED DESCRIPTION OF THE INVENTION

In the following, technical solutions according to embodiments of the disclosure are described clearly and completely in conjunction with the accompanying drawings. Apparently, the described embodiments are merely a part of rather than all of the embodiments of the disclosure. Any other embodiments obtained by those skilled in the art based on the embodiments in the disclosure without any creative works will fall within the scope of the disclosure.

The term "vertical", as used herein, means substantially perpendicular to the surface of a substrate. Propositions, such as "on", "side", "above", "below" are defined with respect to the conventional surface of a substrate regardless of the orientation of the substrate. The term "upwardly" refers to a direction from the bottom to the top.

Figure 1A:
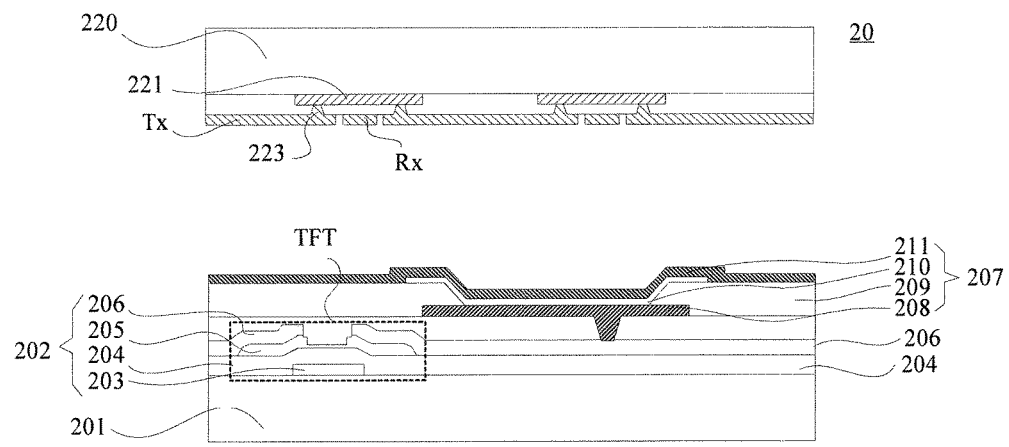
FIG. 1A and FIG. 1B are respective sectional views of a display region and a periphery region of a touch display device according to an embodiment of the disclosure.
Figure 1B:
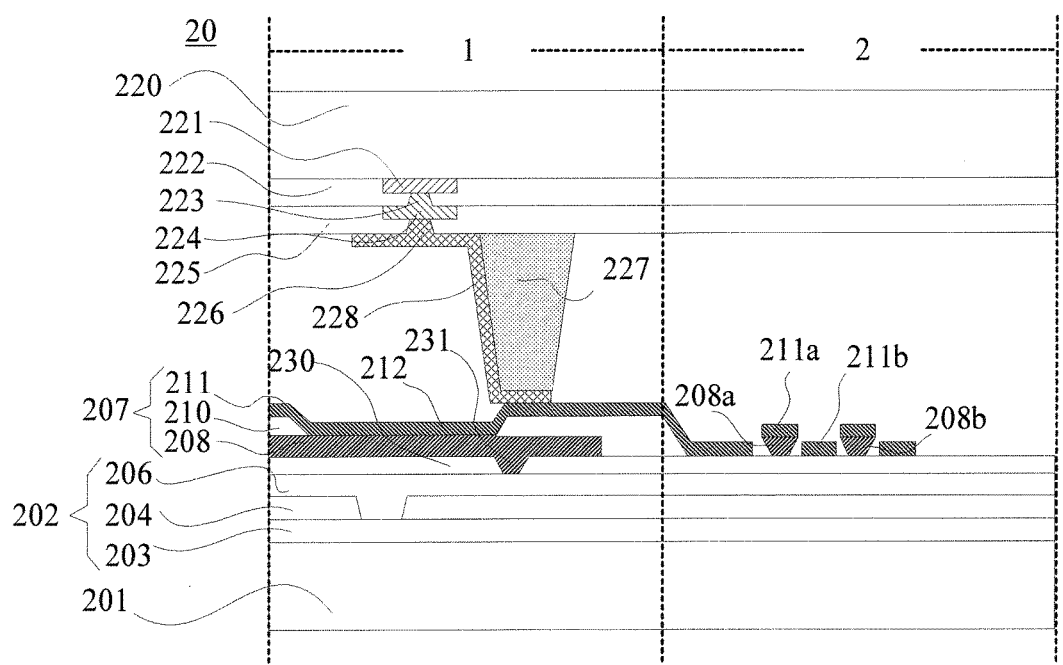

FIG. 1A and FIG. 1B are respective sectional views of a display region and a periphery region of a touch display device 20 according to an embodiment of the disclosure.

As shown in FIG. 1A and FIG. 1B, a thin film transistor element layer 202 is disposed on a first substrate 201. The thin film transistor element layer 202 includes multiple thin film transistor (TFT) switches. The TFT switches each include a gate layer 203, a gate insulating layer 204, a semiconductor layer 205, and a source and drain layer 206 which are successively disposed on the first substrate 201 in the order listed above.

An organic light-emitting pixel layer 207 is disposed on the thin film transistor element layer 202, and the organic light-emitting pixel layer 207 is electrically connected to the thin film transistor element layer 202. The organic light-emitting pixel layer 207 includes a first electrode layer 208, an organic light-emitting layer 209, a pixel defining layer 210 and a second electrode layer 211 which are layered upwardly (from bottom to top) in the order listed above. The first electrode layer 208 is an anode reflective layer. The second electrode layer 211 is a first conductive layer, i.e., a cathode layer. The anode reflective layer 208 includes three layers, i.e., an Indium Tin Oxide (ITO) layer, an argentum layer and an ITO layer which are arranged upwardly (from bottom to top) in the order listed above. The argentum layer may be replaced by a layer of other metal material such as aluminum. The cathode layer 211 includes two layers, i.e., a Magnesium-Argentum (MgAg) layer and an Indium Zinc Oxide (IZO) layer which are arranged upwardly (from bottom to top) in the order listed above.

A touch signal transmission layer is disposed on a second substrate 220. The touch signal transmission layer includes multiple conductive bridges 221. The conductive bridges 221 are covered by a first passivation layer 222. The first passivation layer 222 is provided with a first through hole 223, through which a part of the conductive bridge 221 is exposed. A transparent conductive layer 224 is disposed on the first passivation layer 222. Specifically, the transparent conductive layer 224 includes multiple sensing electrodes $R_x$, each sensing electrode being continuous, and multiple driving segment electrodes Tx separated by the multiple sensing electrodes $R_x$. The multiple driving segment electrodes Tx are electrically connected to the conductive bridge 221 via the first through hole 223, and the multiple driving segment electrodes Tx are electrically connected.

As shown in FIG. 1B, the transparent conductive layer 224 is covered by a second passivation layer 225 and the second passivation layer 225 is provided with a second through hole 226. A spacer 227 is further disposed on the second passivation layer 225. A second conductive layer 228 is disposed at a position of the second through hole 226 and on the spacer 227. The second conductive layer 228 may be a metal layer made of Molybdenum (Mo) or may be a composite metal layer. One part of the second conductive layer 228 is disposed on the spacer 227. That is, a vertical projection of the spacer 227 onto the first substrate 201 partially overlaps a vertical projection of the first conductive layer 211 and a vertical projection of the second conductive layer 228 onto the first substrate 201. Another part of the second conductive layer 228 is disposed on the second passivation layer 225 and is in contact with the transparent conductive layer 224 via the second through hole 226. The second conductive layer 228 is further in contact with the cathode layer 211. The second conductive layer 228 and the cathode layer 211 together form a touch signal transmission unit. The touch signal transmission unit is located in a transmission contact region 1 and in a transmission periphery region 2. In the transmission contact region 1, the anode reflective layer 208 is electrically connected to the thin film transistor element layer 202. In the transmission periphery region 2, the anode reflective layer 208 is provided with at least one island electrode, for example, island electrodes 208a and 208b. The anode reflective layer 208 includes three layers of materials, and different materials have different etching rates for a same etching solution. Here, a mixture solution of hydrogen nitrate ($HNO_3$) and acetic acid ($CH_3COOH$) is used as an etching solution, and the anode reflective layer 208 is etched to form the island electrodes 208a and 208b due to different etching rates for the mixture solution. The width of the island electrodes gradually increases in a direction departing from the thin film transistor element layer, i.e., the island electrodes each has an inverted trapezoidal structure.

In the transmission contact region 1, the pixel defining layer 210 is disposed on the anode reflective layer 208 and is provided with a third through hole 212, through which a part of the anode reflective layer 208 is exposed. The cathode layer 211 is disposed on the pixel defining layer 210 and contacts the anode reflective layer 208 via the third through hole 212.

In the transmission periphery region 2, parts of the cathode layer 211 are formed on the island electrodes 208a and 208b, and other parts of the cathode layer 211 are formed on peripheries of the island electrodes 208a and 208b. The cathode layer 211 is formed by thermal evaporation, and the cathode layer 211 may become disconnected in case of being evaporated onto an uneven region. Since the island electrodes 208a and 208b have the inverted trapezoidal structure, after the thermal evaporation, a cathode layer 211a disposed on the island electrodes 208a and 208b and a cathode layer 211b disposed on the peripheries of the island electrodes 208a and 208b are disconnected and are insulated from each other.

Figure 1C:
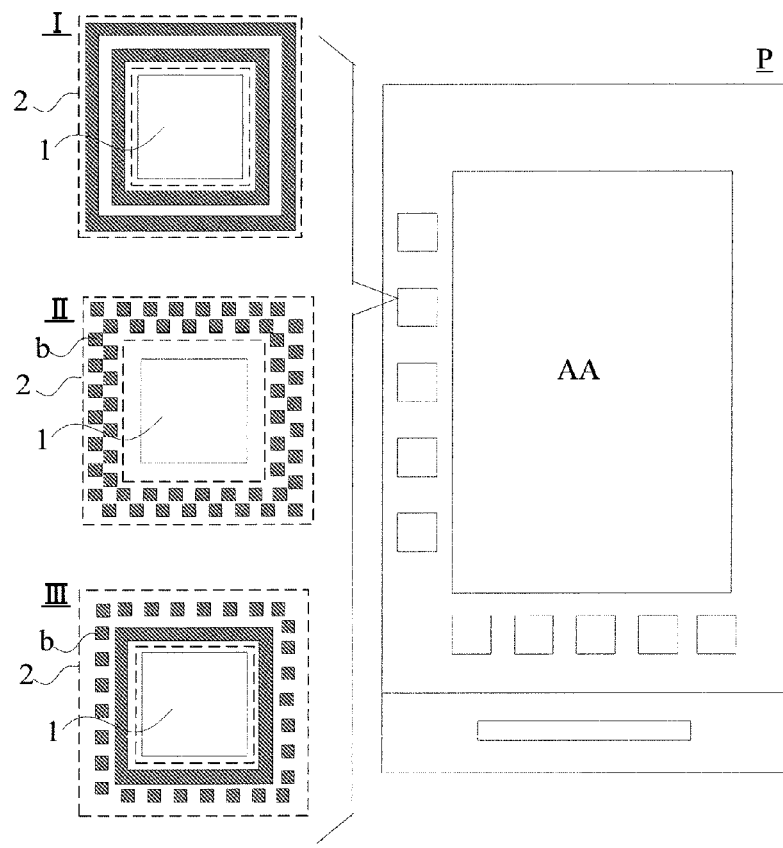
FIG. 1C is a plan view of separation patterns in a touch display device according to an embodiment of the disclosure.

In the transmission periphery region 2, the island electrodes 208a and 208b, and the cathode layer 211a provided on surfaces of the island electrodes 208a and 208b together form a separation pattern. The transmission contact region 1 is surrounded by the separation pattern. The touch signal transmission unit in the transmission contact region 1 of a touch display P is surrounded by the separation pattern; hence, signal interferences between adjacent touch signal transmission units are avoided. Since at least one island electrode is disposed in the transmission periphery region 2, there is at least one separation pattern. The separation pattern may be enclosed, which is shown as case I in FIG. 1C; or the separation pattern may be unenclosed, which is shown as case II in FIG. 1C. The enclosed separation pattern or the unenclosed separation pattern may be rectangular, circular or polygonal. As shown in case I of FIG. 1C, two enclosed separation patterns, each having a rectangular shape, are nested. As shown in case II of FIG. 1C, two unenclosed separation patterns, each having a rectangular shape, are nested (disposed in a nested relationship with respect to each other). Specifically, each of the unenclosed separation patterns includes N sub-separation units b, where the sub-separation units b are not in contact with each other, and N is an integer greater than 1. The sub-separation units b of one unenclosed separation pattern are staggered arranged with respect to the sub-separation units b of an adjacent unenclosed separation pattern. As shown in case III of FIG. 1C, at least one enclosed separation pattern and at least one unenclosed separation pattern are nested. Each of the at least one unenclosed separation pattern includes N sub-separate units b, where the sub-separation units are not in contact with each other, and N is an integer greater than 1. The at least one unenclosed separation pattern has a same shape as the at least one enclosed separation pattern.

In the case that a touch occurs in the display region of the touch display device 20, a touch signal is transmitted from the display region to the periphery region, then transmitted to the thin film transistor element layer 202 sequentially via the conductive bridge 221, the transparent conductive layer 224, the second conductive layer 228, the cathode layer 211 and the anode reflective layer 208, thereby inputting or outputting the touch signal. With the structure for transmitting the touch signal, simplified fabrication process, improved yield, narrowed border of the display and reduced thickness of the display may be achieved.

Figure 2A:
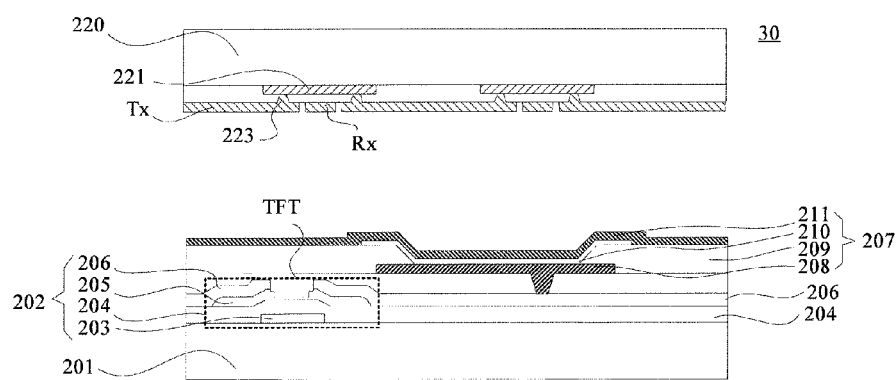
FIG. 2A and FIG. 2B are respective sectional views of a display region and a periphery region of a touch display device according to an embodiment of the disclosure.
Figure 2B:
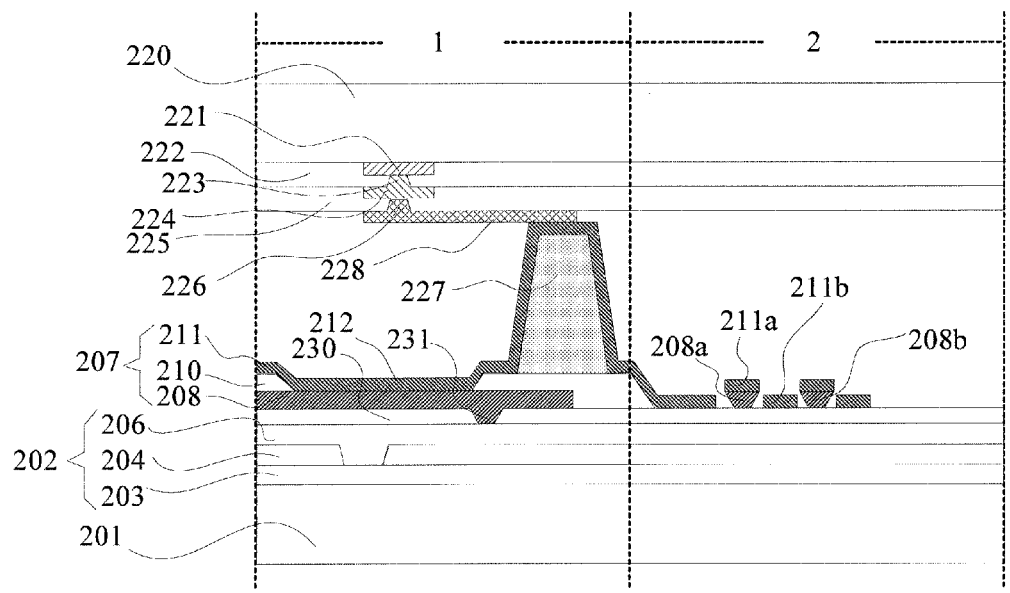

FIG. 2A and FIG. 2B are respective sectional views of a display region and a periphery region of a touch display device 30 according to an embodiment of the disclosure.

As shown in FIG. 2A and FIG. 2B, a thin film transistor element layer 202 is disposed on a first substrate 201. The thin film transistor element layer 202 includes multiple TFT switches. The TFT switches include a gate layer 203, a gate insulating layer 204, a semiconductor layer 205 and a source and drain layer 206 which are successively disposed on the first substrate 201 in the order listed above. An organic light-emitting pixel layer 207 is disposed on the thin film transistor element layer 202, and the organic light-emitting pixel layer 207 is electrically connected to the thin film transistor element layer 202. The organic light-emitting pixel layer 207 includes a first electrode layer 208, an organic light-emitting layer 209, a pixel defining layer 210 and a second electrode layer 211 which are layered upwardly in the order listed above. The first electrode layer 208 is an anode reflective layer. The second electrode layer 211 is a first conductive layer, i.e., a cathode layer. The anode reflective layer 208 includes three layers, i.e., an ITO layer, an argentum layer and an ITO layer which are arranged upwardly in the order listed above, and the argentum layer may be replaced by a layer of metal material such as aluminum. The cathode layer 211 includes two layers, i.e., an MgAg layer and an IZO layer which are arranged upwardly in the order listed above. Different form the touch display device 20 shown in FIG. 1B, in the touch display device 30 according to the embodiment, a spacer 227 is disposed between the pixel defining layer 210 and the cathode layer 211.

A touch signal transmission layer is disposed on a second substrate 220. The touch signal transmission layer includes multiple conductive bridges 221. The conductive bridges 221 are covered by a first passivation layer 222. And the first passivation layer 222 is provided with a first through hole 223, through which a part of the conductive bridge 221 is exposed. A transparent conductive layer 224 is disposed on the first passivation layer 222. Specifically, the transparent conductive layer 224 includes multiple sensing electrodes $R_x$, each sensing electrode being continuous, and multiple driving segment electrodes Tx separated by the multiple sensing electrodes $R_x$. The multiple driving segment electrodes Tx are electrically connected to the conductive bridge 221 through the first through hole 223, and the multiple driving segment electrode s Tx are electrically connected.

As shown in FIG. 2B, the transparent conductive layer 224 is covered by a second passivation layer 225 and the second passivation layer 225 is provided with a second through hole 226.

A second conductive layer 228 is disposed on the second passivation layer 225. The second conductive layer 228 may be a metal layer made of Molybdenum (Mo) or may be a composite metal layer. The second conductive layer 228 is in contact with the transparent conductive layer 224 via the second through hole 226. The second conductive layer 228 is also in contact with the cathode layer 211. The second conductive layer 228 and the cathode layer 211 together form a touch signal transmission unit. The touch signal transmission unit is located in a transmission contact region 1 and a transmission periphery region 2.

In the transmission contact region 1, the anode reflective layer 208 is electrically connected to the thin film transistor element layer 202. In the transmission periphery region 2, the anode reflective layer 208 is provided with at least one island electrode, for example, electrodes 208a and 208b. The anode reflective layer 208 includes three layers of materials, and different materials have different etching rates for a same etching solution. Here, a mixture solution of hydrogen nitrate ($HNO_3$) and acetic acid ($CH_3COOH$) is used as an etching solution, and the anode reflective layer 208 is etched to form the island electrodes 208a and 208b due to different etching rates for the mixture solution. The width of the island electrodes gradually increases in a direction departing from the thin film transistor element layer, i.e., the island electrodes each has an inverted trapezoidal structure.

In the transmission contact region 1, the pixel defining layer 210 is disposed on the anode reflective layer 208 and is provided with a third through hole 212, through which a part of the anode reflective layer 208 is exposed.

In the transmission contact region 1, the spacer 227 is disposed on the pixel defining layer 210, a part of the cathode layer 211 is disposed on the spacer 227 and is in contact with the second conductive layer 228, and a part of the cathode layer 211 is in contact with the anode reflective layer 208 via the third through hole 212.

In the transmission periphery region 2, parts of the cathode layer 211 are formed on the island electrodes 208a and 208b, and other parts of the cathode layer 211 are formed on peripheries of the island electrodes 208a and 208b. The cathode layer 211 is formed by thermal evaporation, and the cathode layer 211 may become disconnected in case of being evaporated onto an uneven region. Since the island electrodes 208a and 208b have the inverted trapezoidal structure, after the thermal evaporation, a cathode layer 211a disposed on the island electrodes 208a and 208b and a cathode layer 211b disposed on the peripheries of the island electrodes 208a and 208b are disconnected and are insulated from each other.

In the transmission periphery region 2, the island electrodes 208a and 208b and the cathode layer 211a provided on surfaces of the island electrodes 208a and 208b together form a separation pattern. The transmission contact region 1 is surrounded by the separation pattern. The touch signal transmission unit in the transmission contact region 1 of a touch display P is surrounded by the separation pattern; hence, signal interferences between adjacent touch signal transmission units may be avoided. Since at least one island electrode is disposed in the transmission periphery region 2, there is at least one separation pattern. The separation pattern may be enclosed, which is shown as case I in FIG. 1C; or the separation pattern may be unenclosed, which is shown as case II in FIG. 1C. The enclosed separation pattern or the unenclosed separation pattern may be rectangular, circular or polygonal. As shown in case I of FIG. 1C, two enclosed separation patterns, each having a rectangular shape, are nested. As shown in case II of FIG. 1C, two unenclosed separation patterns, each having a rectangular shape, are nested. Specifically, each of the unenclosed separation patterns includes N sub-separation units b, where the sub-separation units are not in contact with each other, and N is an integer greater than 1. The sub-separation units b of one unenclosed separation pattern are staggered arranged with respect to the sub-separation units b of an adjacent unenclosed separation pattern. As shown in case III of FIG. 1C, at least one enclosed separation pattern and at least one unenclosed separation pattern are nested. Each of the at least one unenclosed separation pattern includes N sub-separation units b, where the sub-separation units are not in contact with each other, and N is an integer greater than 1. The at least one unenclosed separation pattern has a same shape as the at least one enclosed separation pattern.

In the case that a touch occurs in the display region of the touch display device 30, a touch signal is transmitted from the display region to the periphery region, then transmitted to the thin film transistor element layer 202 sequentially via the conductive bridge 221, the transparent conductive layer 224, the second conductive layer 228, the cathode layer 211 and the anode reflective layer 208, thereby inputting and outputting the touch signal. With the structure for transmitting the touch signal, simplified fabrication process, improved yield, narrowed border of the display and reduced thickness of the display may be achieved.

Figure 3A:
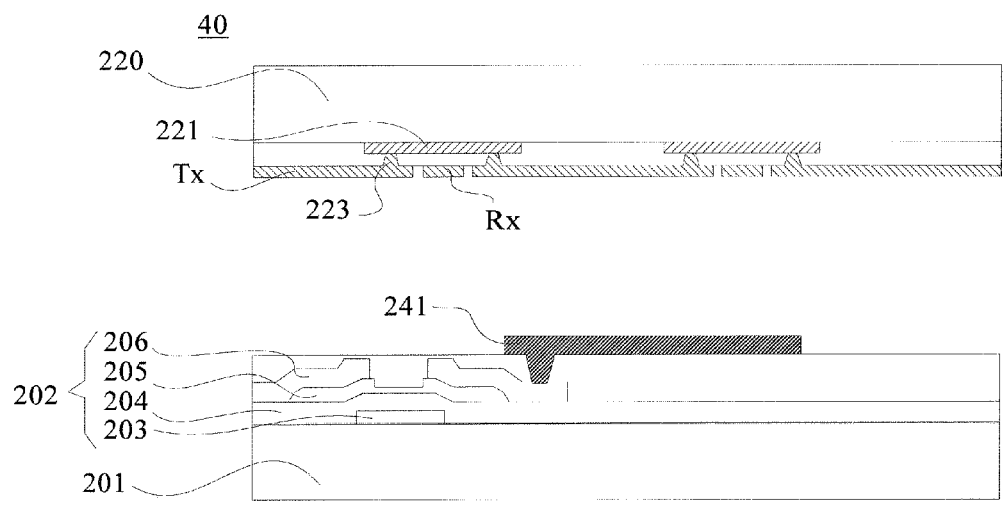
FIG. 3A and FIG. 3B are respective sectional views of a display region and a periphery region of a touch display device according to an embodiment of the disclosure.
Figure 3B:
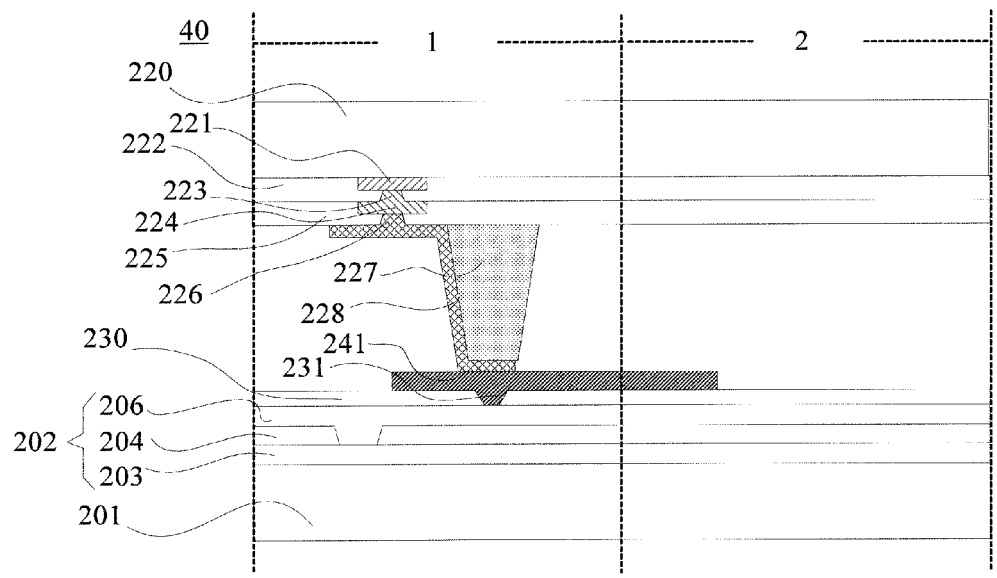

FIG. 3A and FIG. 3B are respective sectional views of a display region and a periphery region of a touch display device 40 according to an embodiment of the disclosure.

As shown in FIG. 3A and FIG. 3B, a thin film transistor element layer 202 is disposed on a first substrate 201. The thin film transistor element layer 202 includes multiple TFT switches. The TFT switches include a gate layer 203, a gate insulating layer 204, a semiconductor layer 205, and a source and drain layer 206 which are successively disposed on the first substrate 201 in the order listed above.

A first conductive layer 241 is disposed on the thin film transistor element layer 202. The first conductive layer 241 is a pixel electrode layer. The pixel electrode layer 241 is electrically connected to the thin film transistor element layer 202.

A touch signal transmission layer is disposed on a second substrate 220. The touch signal transmission layer includes multiple conductive bridges 221. The conductive bridges 221 are covered with a first passivation layer 222. The first passivation layer 222 is provided with a first through hole 223, through which a part of the conductive bridge 221 is exposed. A transparent conductive layer 224 is disposed on the first passivation layer 222. Specifically, the transparent conductive layer 224 includes multiple sensing electrodes $R_x$, each sensing electrode being continuous, and multiple driving segment electrodes Tx separated by the multiple sensing electrodes $R_x$. The multiple driving segment electrodes Tx are electrically connected to the conductive bridge 221 via the first through hole 223, and the multiple driving segment electrodes Tx are electrically connected.

As shown in FIG. 3B, the transparent conductive layer 224 is covered by a second passivation layer 225 and the second passivation layer 225 is provided with a second through hole 226.

A spacer 227 is further disposed on the second passivation layer 225. A second conductive layer 228 is disposed at a position of the second through hole 226 and on the spacer 227. The second conductive layer 228 may be a metal layer made of Molybdenum (Mo) or may be a composite metal layer. One part of the second conductive layer 228 is disposed on the spacer 227. That is, a vertical projection of the spacer 227 onto the first substrate 201 partially overlaps with vertical projections of the first conductive layer 241 and the second conductive layer 228 onto the first substrate 201. Another part of the second conductive layer 228 is disposed on the second passivation layer 225 and is in contact with the transparent conductive layer 224 via the second through hole 226. The second conductive layer 228 is further in contact with the pixel electrode layer 241. The second conductive layer 228 and the pixel electrode layer 241 together form a touch signal transmission unit.

In the case that a touch occurs in the display region of the touch display device 40, a touch signal is transmitted from the display region to the periphery region, then transmitted to the thin film transistor element layer 202 sequentially via the conductive bridge 221, the transparent conductive layer 224, the second conductive layer 228 and the pixel electrode layer 241, thereby inputting and outputting the touch signal. With the structure for transmitting the touch signal, simplified fabrication process, improved yield, narrowed border of a display and reduced thickness of the display may be achieved.

It should be noted that the pixel electrode layer in the periphery region is disconnected with and insulated from a pixel electrode in the display region; hence, the pixel electrode in the display region may not be influenced when the touch signal is transmitted in the pixel electrode layer in the periphery region.

Figure 4A:
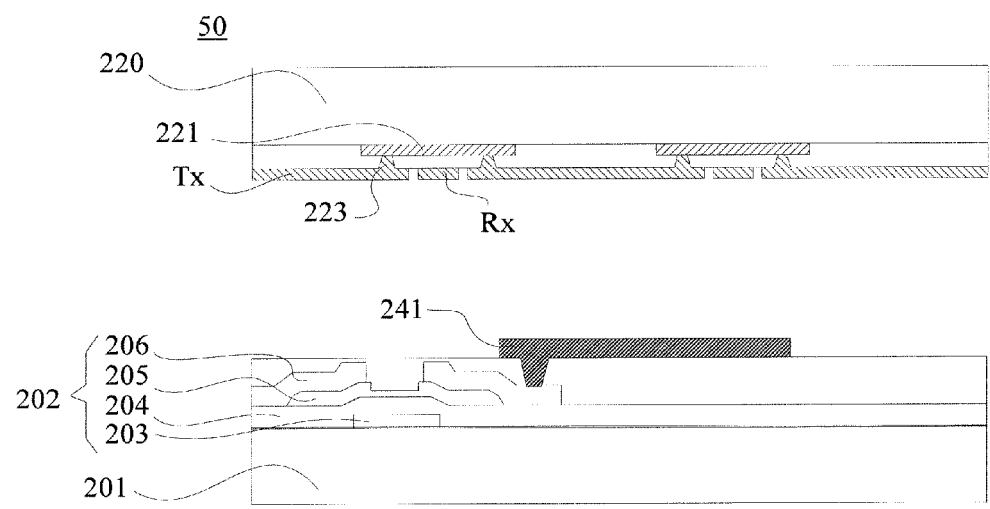
FIG. 4A and FIG. 4B are respective sectional views of a display region and a periphery region of a touch display device according to an embodiment of the disclosure.
Figure 4B:
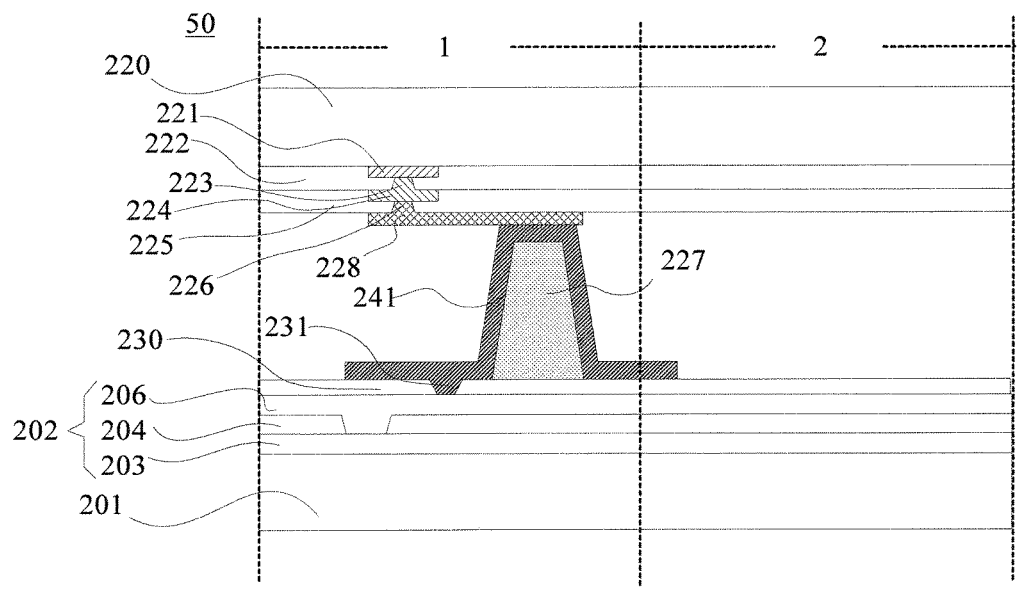

FIG. 4A and FIG. 4B are respective sectional views of a display region and a periphery region of a touch display device 50 according to an embodiment of the disclosure.

As shown in FIG. 4A and FIG. 4B, a thin film transistor element layer 202 is disposed on a first substrate 201. The thin film transistor element layer 202 includes multiple TFT switches. The TFT switches include a gate layer 203, a gate insulating layer 204, a semiconductor layer 205, and a source and drain layer 206 which are successively disposed on the first substrate 201 in the order listed above.

Different from the touch display device 40 shown in FIG. 3B, in the touch display device 50 according to the embodiment, a spacer 227 is disposed between the thin film transistor element layer 202 and a pixel electrode layer 241. That is, the spacer 227 is disposed on the thin film transistor element layer 202, and a first conductive layer 241 is disposed on the spacer 227.

The first conductive layer 241 is a pixel electrode layer. The pixel electrode layer 241 is electrically connected to the thin film transistor element layer 202.

A touch signal transmission layer is disposed on a second substrate 220. The touch signal transmission layer includes multiple conductive bridges 221. The conductive bridges 221 are covered with a first passivation layer 222. The first passivation layer 222 is provided with a first through hole 223, through which a part of the conductive bridge 221 is exposed. A transparent conductive layer 224 is disposed on the first passivation layer 222. Specifically, the transparent conductive layer 224 includes multiple sensing electrodes $R_x$, each sensing electrode being continuous, and multiple driving segment electrodes Tx separated by the multiple sensing electrodes $R_x$. The multiple driving segment electrodes Tx are electrically connected to the conductive bridge 221 via the first through hole 223, and the multiple driving segment electrodes Tx are electrically connected.

As shown in FIG. 4B, the transparent conductive layer 224 is covered by a second passivation layer 225 and the second passivation layer 225 is provided with a second through hole 226.

A second conductive layer 228 is further disposed on the second passivation layer 225. The second conductive layer 228 may be a metal layer made of Molybdenum (Mo) or may be a composite metal layer. The second conductive layer 228 is in contact with the transparent conductive layer 224 via the second through hole 226. The second conductive layer 228 is further in contact with the pixel electrode layer 241. The second conductive layer 228 and the pixel electrode layer 241 together form a touch signal transmission unit. In the case that a touch occurs in a display region of a touch display device 50, a touch signal is transmitted from the display region to the periphery region, and then transmitted to the thin film transistor element layer 202 sequentially via the conductive bridge 221, the transparent conductive layer 224, the second conductive layer 228 and the pixel electrode layer 241, thereby inputting and outputting the touch signal. With this structure for transmitting the touch signal, simplified fabrication process, improved yield, narrowed border of a display and reduced thickness of the display may be achieved.

It should be noted that the pixel electrode layer in the periphery region is disconnected with and insulated from a pixel electrode in the display region; hence, the pixel electrode in the display region may not be influenced when the touch signal is transmitted in the pixel electrode layer in the periphery region.

FIG. 5A to FIG. 5M illustrate a flow of a method for manufacturing a touch display device 20 according to an embodiment of the disclosure.

Figure 5A:
FIG. 5A to FIG. 5M illustrate a flow of a method for manufacturing a touch display device according to an embodiment of the disclosure.
Figure 5B:
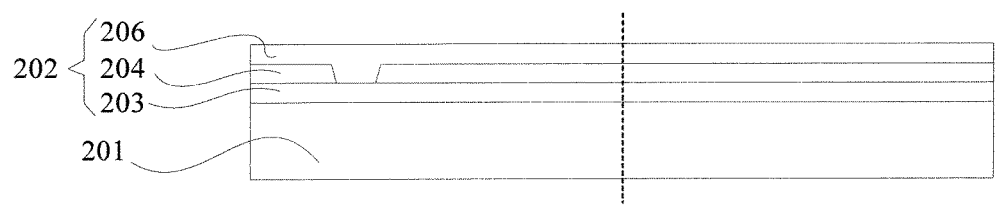

As shown in FIG. 5A, a first substrate 201 is provided. As shown in FIG. 5B, a thin film transistor element layer 202 is formed on the first substrate 201. The thin film transistor element layer 202 includes multiple TFT switches. The TFT switches include a gate layer 203, a gate insulating layer 204, a semiconductor layer 205 and a source and drain layer 206 which are successively formed on the first substrate 201 in the order listed above.

Figure 5C:
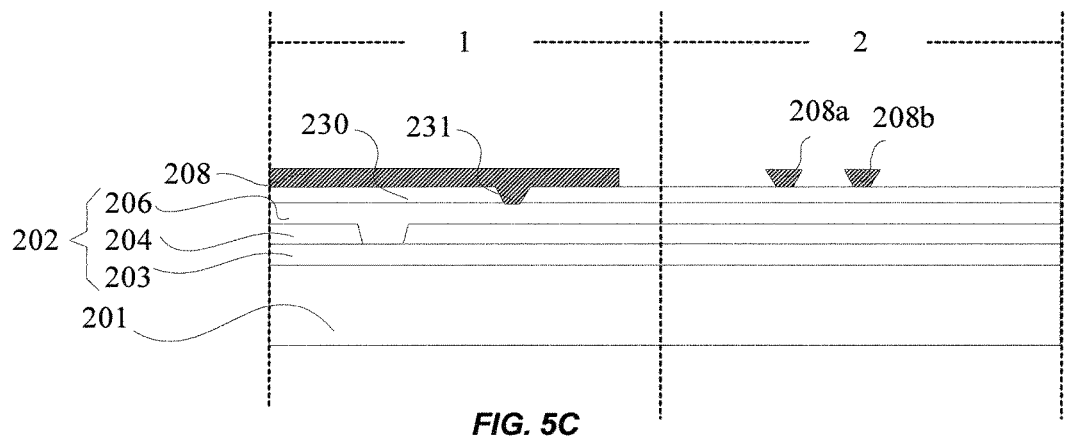

As shown in FIG. 5C, a passivation layer 230 is formed on the thin film transistor element layer 202. The passivation layer 230 is etched to form a through hole 231, through which a part of the source and drain layer 206 is exposed. Thereafter a first electrode layer 208 is formed. The first electrode layer 208 is an anode reflective layer. The anode reflective layer 208 is etched. In a transmission contact region 1, the anode reflective layer 208 is electrically connected to the thin film transistor element layer 202 via the through hole 231. In a transmission periphery region 2, the anode reflective layer 208 is etched to form at least one island electrode, for example, island electrodes 208a and 208b. The anode reflective layer 208 includes three layers of materials, and different materials have different etching rates for a same etching solution. Here a mixture solution of hydrogen nitrate ($HNO_3$) and acetic acid ($CH_3COOH$) is used as an etching solution, and the anode reflective layer 208 is etched to form the island electrodes 208a and 208b due to different etching rates for the mixture solution, each of the island electrodes has an inverted trapezoidal structure.

Figure 5D:
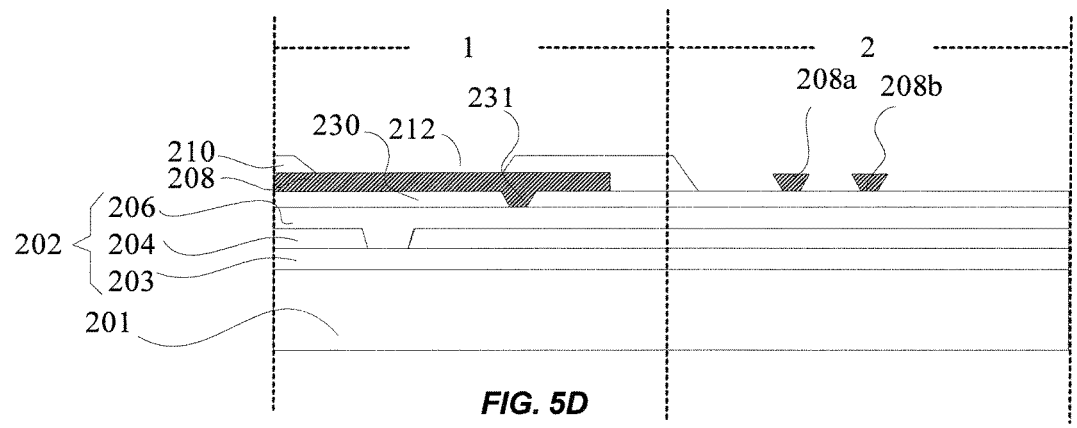

As shown in FIG. 5D, a pixel defining layer 210 is formed on the anode reflective layer 208, and the pixel defining layer 210 is etched. In the transmission contact region 1, a part of the pixel definition layer 210 is etched to form a third through hole 212, through which a part of the anode reflective layer 208 is exposed. The pixel defining layer 210 in the transmission periphery region 2 is removed through etching.

Figure 5E:
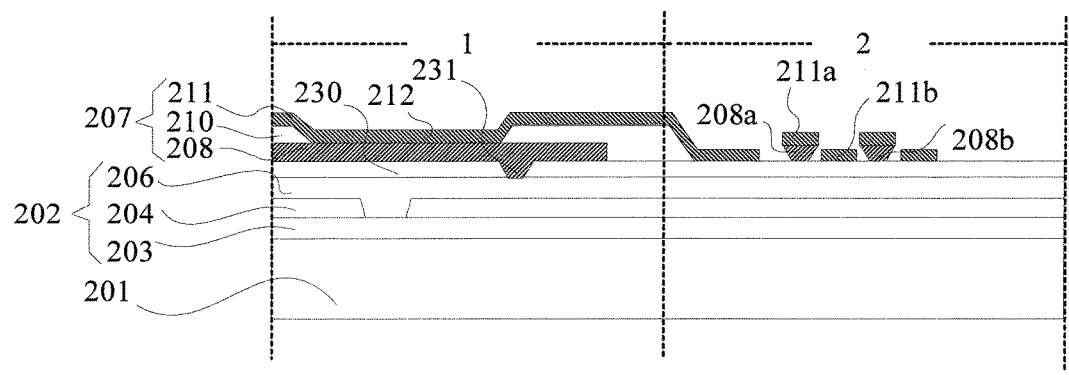

As shown in FIG. 5E, a cathode layer 211 is formed on the pixel defining layer 210 by thermal evaporation. In the transmission contact region 1, one part of the cathode layer 211 is formed on the pixel defining layer 210, and another part of the cathode layer 211 is in contact with the anode reflective layer 208 via the third through hole 212. In the transmission periphery region 2, parts of the cathode layer 211 are formed on the island electrodes 208a and 208b, and other parts of the cathode layer 211 are formed on peripheries of the island electrodes 208a and 208b. The cathode layer 211 is formed by thermal evaporation, and the cathode layer 211 may become disconnected in case of being evaporated onto an uneven region. Since the island electrodes 208a and 208b have the inverted trapezoidal structure, after the thermal evaporation, a cathode layer 211a disposed on the island electrodes 208a and 208b and a cathode layer 211b disposed on the peripheries of the island electrodes 208a and 208b are disconnected and are insulated from each other. In the transmission periphery region 2, the island electrodes 208a and 208b, and the cathode layer 211a provided on surfaces of the island electrodes 208a and 208b together form a separation pattern. The transmission contact region 1 is surrounded by the separation pattern. The touch signal transmission unit in the transmission contact region 1 of a touch panel P is surrounded by the separation pattern; hence, signal interferences between adjacent touch signal transmission units may be avoided. The separation pattern may be enclosed or unenclosed. The enclosed separation pattern or the unenclosed separation pattern may be rectangular, circular or polygonal. Specific arrangement of the separation pattern may be referred in FIG. 1C and are not described in detail herein.

Figure 5F:
Figure 5G:
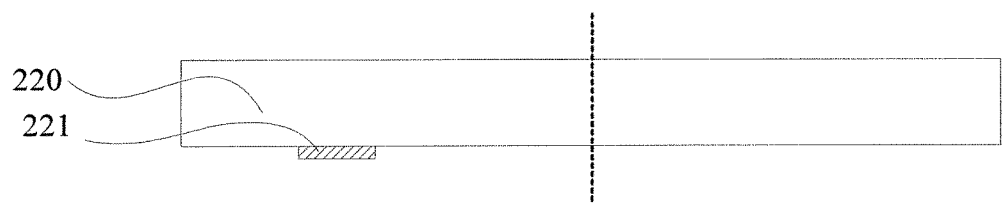
Figure 5H:
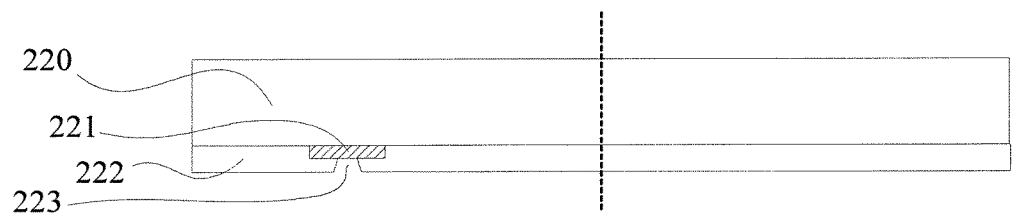
Figure 5I:
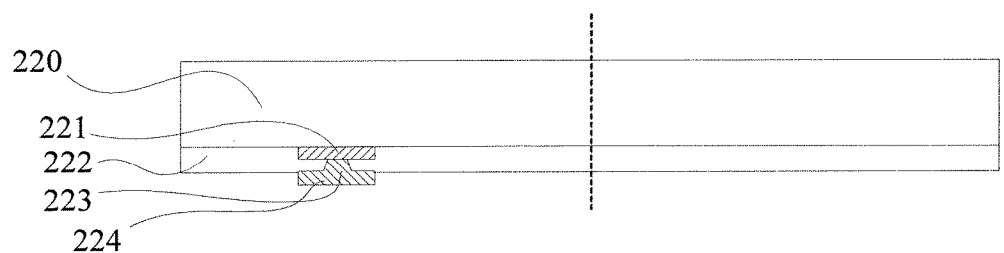
Figure 5J:
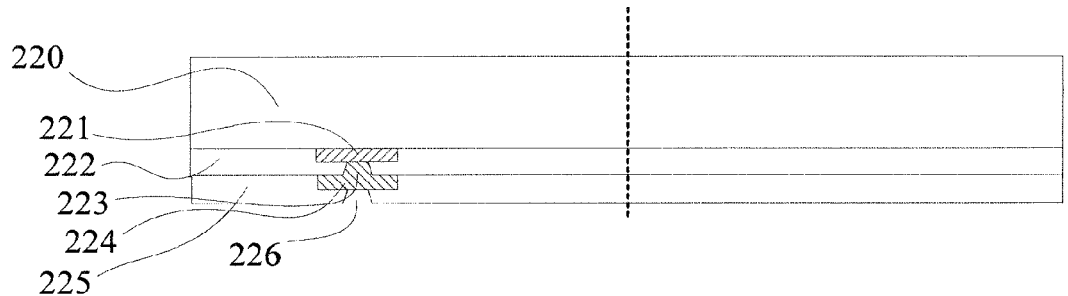
Figure 5K:
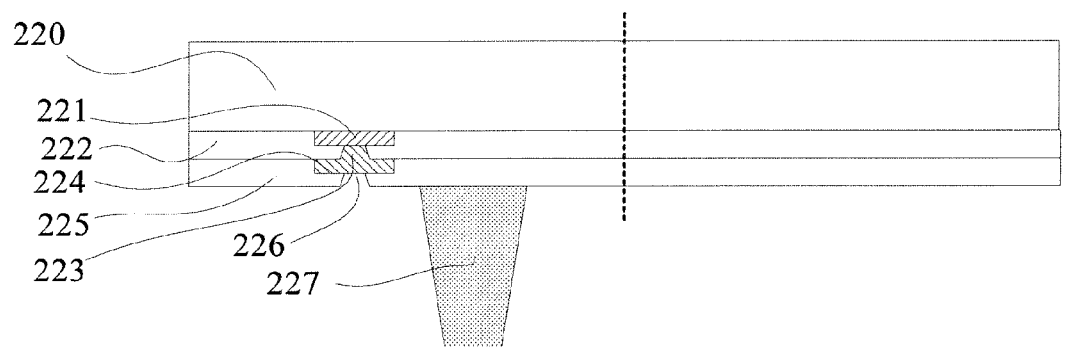
Figure 5L:
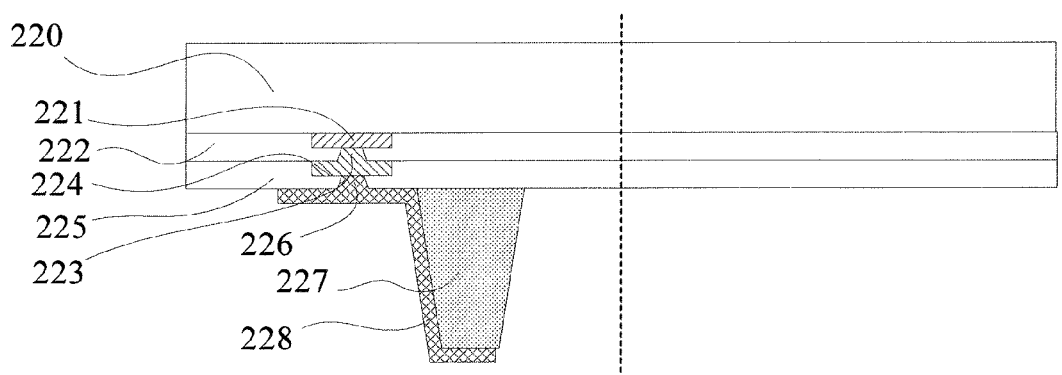
Figure 5M:
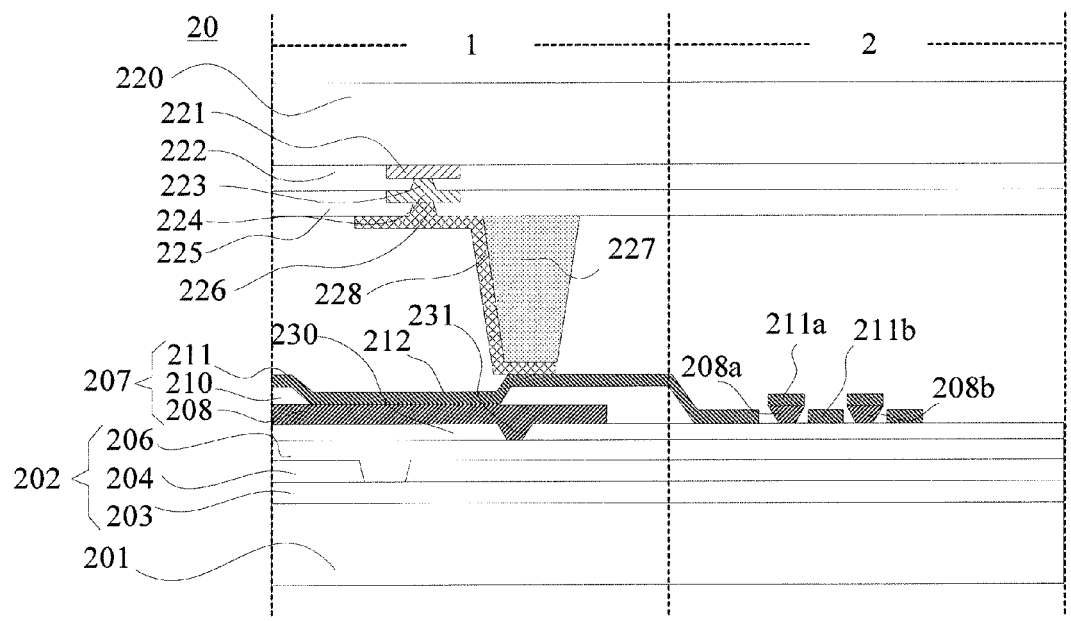

As shown in FIG. 5F, a second substrate 220 is provided. As shown in FIG. 5G, a first metal layer is formed on the second substrate 220, and then the first metal layer is etched to form a conductive bridge 221. As shown in FIG. 5H, a first passivation layer 222 is formed on the conductive bridge 221, and then the first passivation layer 222 is etched to form a first through hole 223, through which a part of the conductive bridge 221 is exposed. As shown in FIG. 5I, a transparent conductive layer 224 is formed on the first passivation layer 222. The transparent conductive layer 224 is in contact with the metal bridge 221 via the first through hole 223. The transparent conductive layer 224 is etched to form, in a display region, multiple sensing electrodes $R_x$ and multiple driving segment electrodes Tx separated from the multiple sensing electrodes $R_x$. Each of the sensing electrodes is continuous. As shown in FIG. 5J, a second passivation layer 225 is formed on the transparent conductive layer 224. The second passivation layer 225 is etched to form a second through hole 226, through which a part of the transparent conductive layer 224 is exposed. As shown in FIG. 5K, a spacer 227 is formed on the second passivation layer 225. As shown in FIG. 5L, a second conductive layer 228 is formed on the spacer 227 by sputtering. The second conductive layer 228 may be a metal layer made of Mo or may be a composite metal layer. One part of the second conductive layer 228 is formed on the spacer 227, and another part of the second conductive layer 228 is formed on the second passivation layer 225 and is in contact with the transparent conductive layer 224 via the second through hole 226. The second conductive layer 228 is further in contact with the cathode layer 211. As shown in FIG. 5M, the second conductive layer 228 and the cathode layer 211 together form a touch signal transmission unit.

FIG. 6A to FIG. 6M illustrate a flow of a method for manufacturing a touch display device 30 according to an embodiment of the disclosure.

Figure 6A:
FIG. 6A to FIG. 6M illustrate cross-sectional views of intermediate stages of a method for manufacturing a touch display device according to an embodiment of the disclosure.
Figure 6B:

As shown in FIG. 6A, a first substrate 201 is provided. As shown in FIG. 6B, a thin film transistor element layer 202 is formed on the first substrate 201. The thin film transistor element layer 202 includes multiple TFT switches. The TFT switches include a gate layer 203, a gate insulating layer 204, a semiconductor layer 205, and a source and drain layer 206 which are successively formed on the first substrate 201 in the order listed above.

Figure 6C:
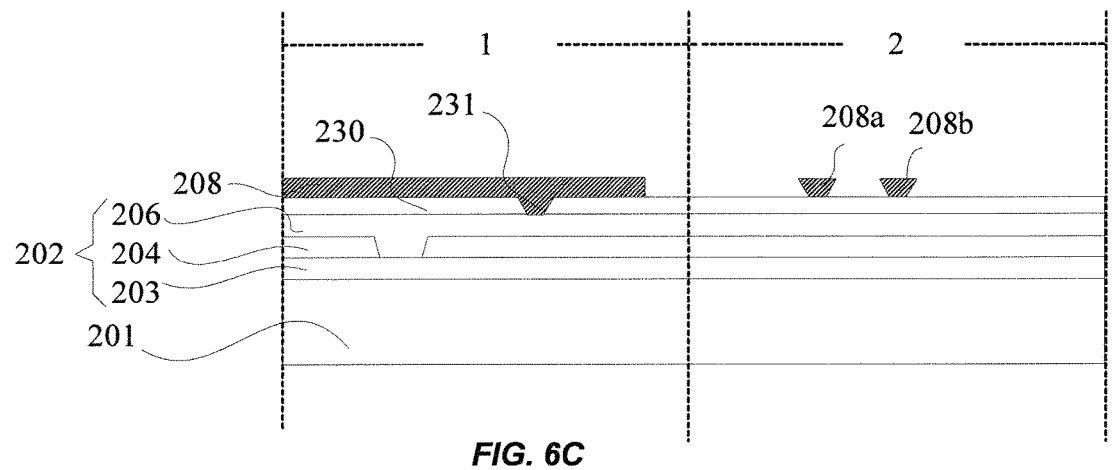

As shown in FIG. 6C, a passivation layer 230 is formed on the thin film transistor element layer 202. The passivation layer 230 is etched to form a through hole 231, through which a part of the source and drain layer 206 is exposed. Thereafter a first electrode layer 208 is formed. The first electrode layer 208 is an anode reflective layer. The anode reflective layer 208 is etched. In a transmission contact region 1, the anode reflective layer 208 is electrically connected to the thin film transistor element layer 202 via the through hole 231. In a transmission periphery region 2, the anode reflective layer 208 is etched to form at least one island electrode, for example, island electrodes 208a and 208b. The anode reflective layer 208 includes three layers of different materials, and the different materials have different etching rates for a same etching solution. Here a mixture solution of hydrogen nitrate ($HNO_3$) and acetic acid ($CH_3COOH$) is used as an etching solution, and the anode reflective layer 208 is etched to form the island electrodes 208a and 208b due to different etching rates for the mixture solution, each of the island electrodes has an inverted trapezoidal structure.

Figure 6D:
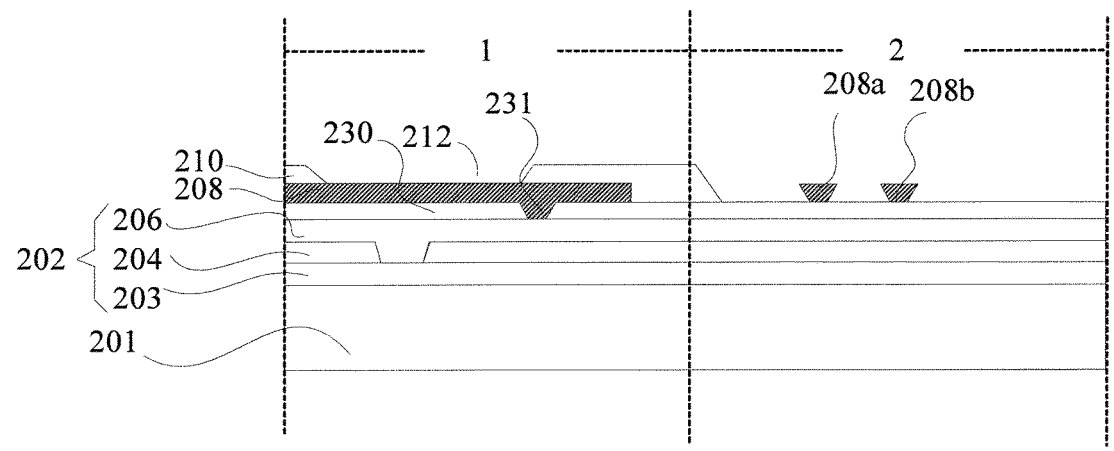

As shown in FIG. 6D, a pixel defining layer 210 is formed on the anode reflective layer 208, and the pixel defining layer 210 is etched. In the transmission contact region 1, a part of the pixel defining layer 210 is etched to form a third through hole 212, through which a part of the anode reflective layer 208 is exposed. The pixel defining layer 210 in the transmission periphery region 2 is removed through etching.

Figure 6E:
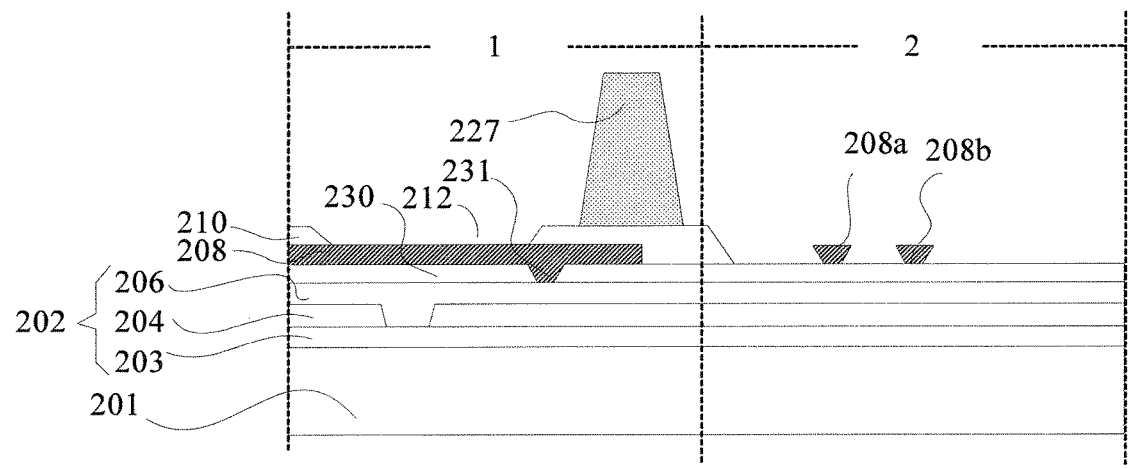
Figure 6F:
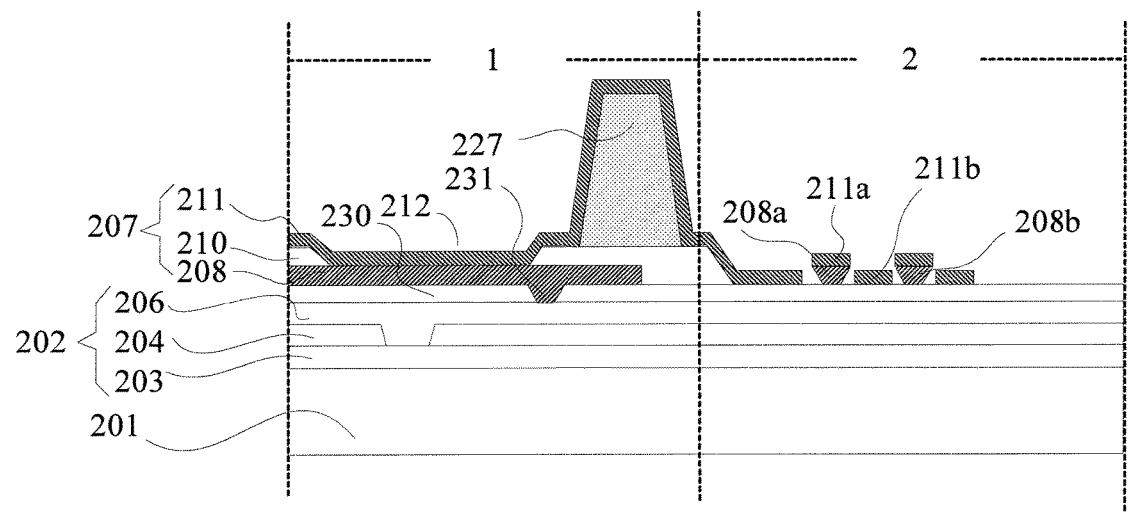

As shown in FIG. 6E, a spacer 227 is formed on the pixel defining layer 210. As shown in FIG. 6F, a cathode layer 211 is formed on the spacer 227 by thermal evaporation. In the transmission contact region 1, a part of the cathode layer 211 is formed on the spacer 227, a part of the cathode layer 211 is formed on the pixel defining layer 210, and a part of the cathode layer 211 is in contact with the anode reflective layer 208 via the third through hole 212. In the transmission periphery region 2, parts of the cathode layer 211 are formed on the island electrodes 208a and 208b, and other parts of the cathode layer 211 are formed on peripheries of the island electrodes 208a and 208b. The cathode layer 211 is formed by thermal evaporation, and the cathode layer 211 may become disconnected in case of being evaporated onto an uneven region. Since the island electrodes 208a and 208b have the inverted trapezoidal structure, after the thermal evaporation, a part of the cathode layer 211 disposed on the island electrodes 208a and 208b and a part of the cathode layer 211 disposed on the peripheries of the island electrodes 208a and 208b are disconnected and are insulated from each other. In the transmission periphery region 2, the island electrodes 208a and 208b, and the cathode layer 211a provided on surfaces of the island electrodes 208a and 208b together form a separation pattern. The transmission contact region 1 is surrounded by the separation pattern. The touch signal transmission unit in the transmission contact region 1 of a touch display P is surrounded by the separation pattern; hence, signal interferences between adjacent touch signal transmission units may be avoided. The separation pattern may be enclosed or unenclosed. The enclosed separation pattern or the unenclosed separation pattern may be rectangular, circular or polygonal. Specific arrangement of the separation pattern may be referred in FIG. 1C and are not described in detail herein.

Figure 6G:
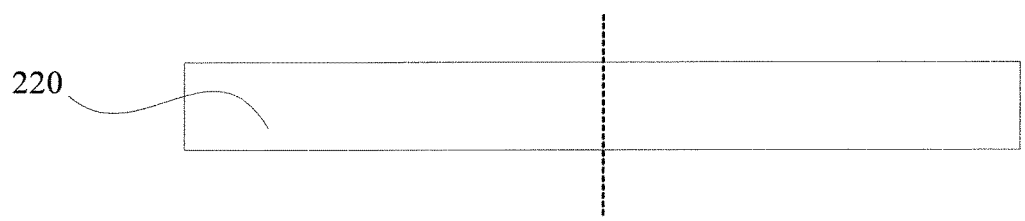
Figure 6H:
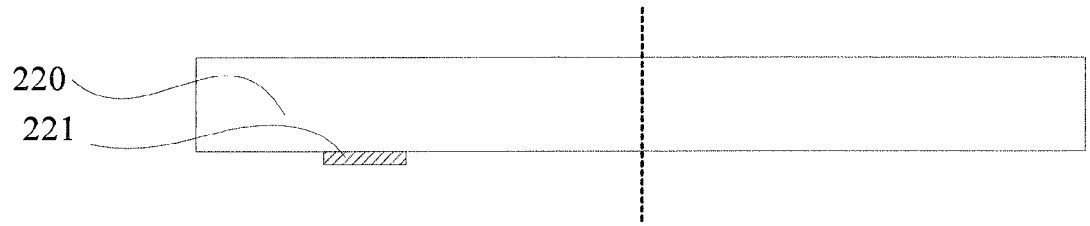
Figure 6I:
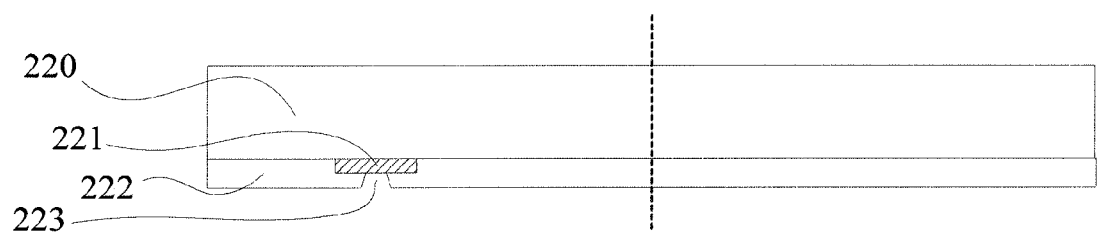
Figure 6J:
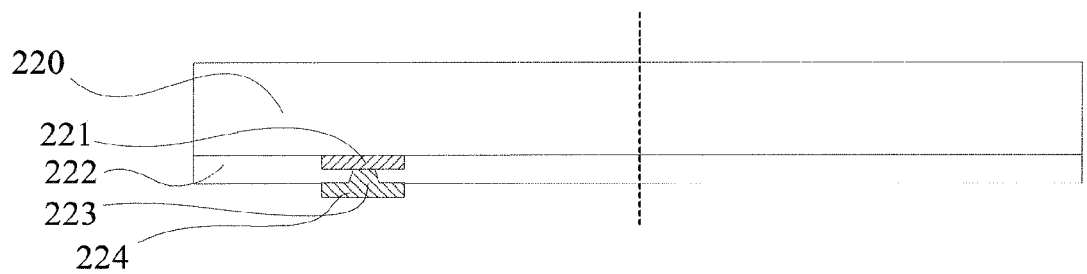
Figure 6K:
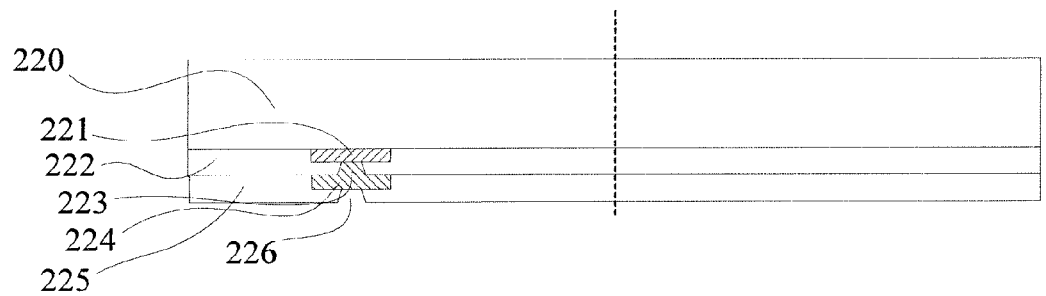

As shown in FIG. 6G, a second substrate 220 is provided. As shown in FIG. 6H, a first metal layer is formed on the second substrate 220, and then the first metal layer is etched to form a conductive bridge 221. As shown in FIG. 6I, a first passivation layer 222 is formed on the conductive bridge 221, and then the first passivation layer 222 is etched to form a first through hole 223, through which a part of the conductive bridge 221 is exposed. As shown in FIG. 6J, a transparent conductive layer 224 is formed on the first passivation layer 222. The transparent conductive layer 224 is in contact with the metal bridge 221 via the first through hole 223. The transparent conductive layer 224 is etched to form, in a display region, multiple sensing electrodes $R_x$ and multiple driving segment electrodes Tx separated by the multiple sensing electrodes $R_x$. Each of the sensing electrodes is continuous. As shown in FIG. 6K, a second passivation layer 225 is formed on the transparent conductive layer 224. The second passivation layer 225 is etched to form a second through hole 226, through which a part of the transparent conductive layer 224 is exposed.

Figure 6L:
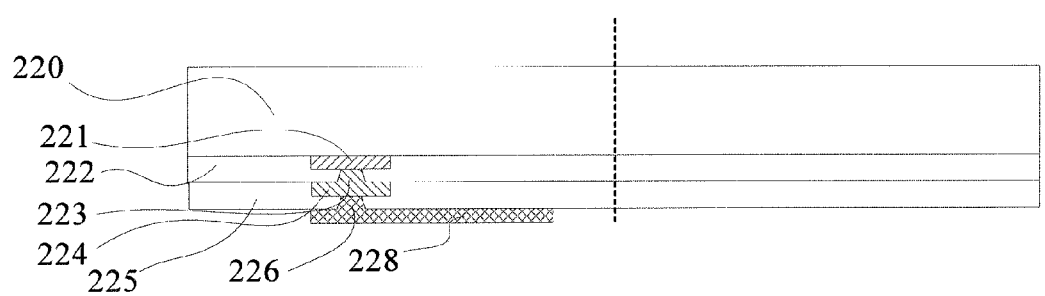

As shown in FIG. 6L, a second conductive layer 228 is formed on the second passivation layer 225 by sputtering.

Figure 6M:
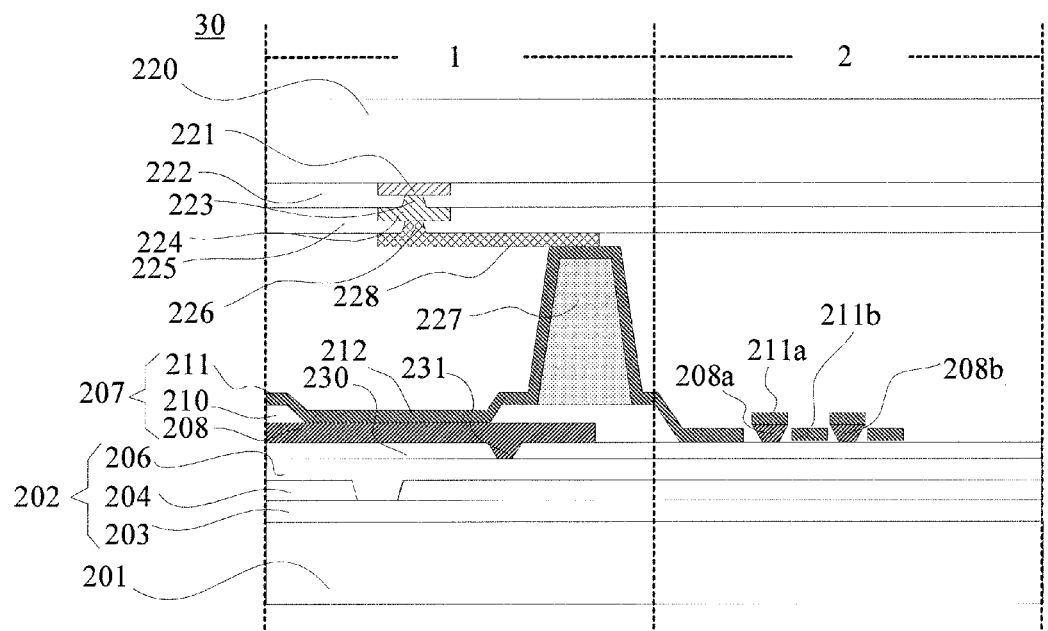

The second conductive layer 228 may be a metal layer made of Mo or may be a composite metal layer. The second conductive layer 228 is formed on the second passivation layer 225 and is in contact with the transparent conductive layer 224 via the second through hole 226. The second conductive layer 228 is further in contact with the cathode layer 211. As shown in FIG. 6M, the second conductive layer 228 and the cathode layer 211 together form a touch signal transmission unit.

FIG. 7A to FIG. 7K illustrate a flow of a method for manufacturing a touch display device 40 according to an embodiment of the disclosure.

Figure 7A:
FIG. 7A to FIG. 7K illustrate cross-sectional views of intermediate stages of a method for manufacturing a touch display device according to an embodiment of the disclosure.
Figure 7B:
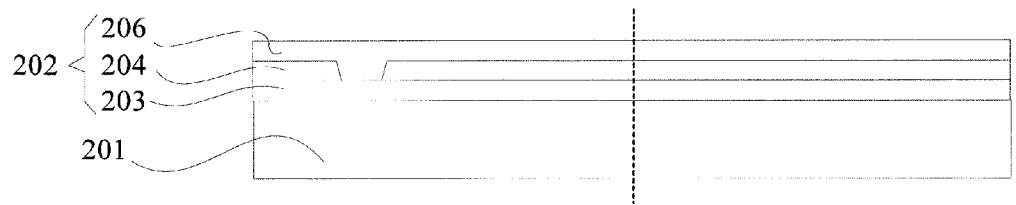

As shown in FIG. 7A, a first substrate 201 is provided. As shown in FIG. 7B, a thin film transistor element layer 202 is formed on the first substrate 201. The thin film transistor element layer 202 includes multiple TFT switches. The TFT switches include a gate layer 203, a gate insulating layer 204, a semiconductor layer 205, and a source and drain layer 206 which are successively formed on the first substrate 201 in the order listed above.

Figure 7C:
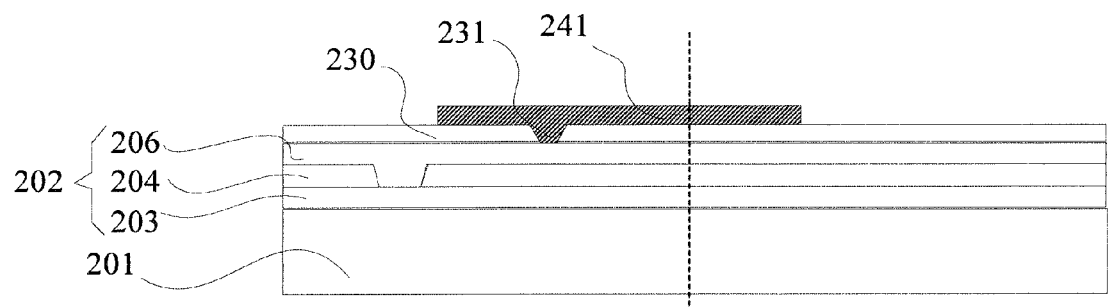

As shown in FIG. 7C, a passivation layer 230 is formed on the thin film transistor element layer 202. The passivation layer 230 is etched to form a through hole 231, through which a part of the source and drain layer 206 is exposed. Thereafter a first conductive layer 241 is formed. The first conductive layer 241 is a pixel electrode layer. The pixel electrode layer 241 is electrically connected to the thin film transistor element layer 202 via the through hole 231, and then the pixel electrode layer 241 is etched.

Figure 7D:
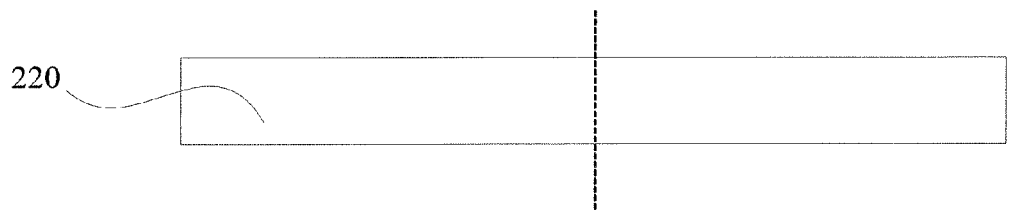
Figure 7E:
Figure 7F:
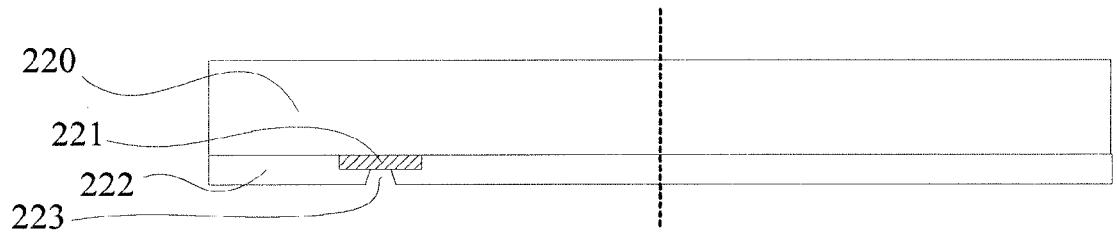
Figure 7G:
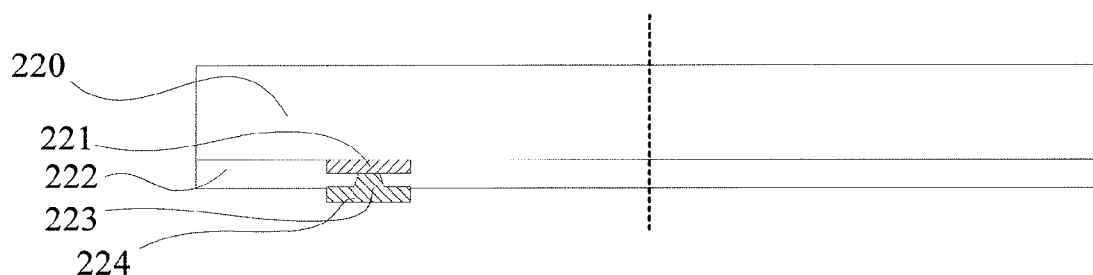
Figure 7H:
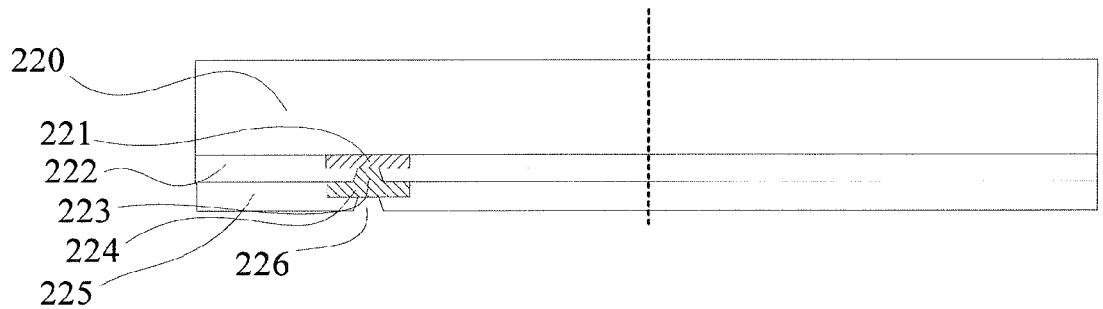

As shown in FIG. 7D, a second substrate 220 is provided. As shown in FIG. 7E, a first metal layer is formed on the second substrate 220, and then the first metal layer is etched to form a conductive bridge 221. As shown in FIG. 7F, a first passivation layer 222 is formed on the conductive bridge 221, and then the first passivation layer 222 is etched to form a first through hole 223, through which a part of the conductive bridge 221 is exposed. As shown in FIG. 7G, a transparent conductive layer 224 is formed on the first passivation layer 222. The transparent conductive layer 224 is in contact with the metal bridge 221 via the first through hole 223. The transparent conductive layer 224 is etched to form, in a display region, multiple sensing electrodes $R_x$ and multiple driving segment electrodes Tx separated by the multiple sensing electrodes $R_x$. Each of the sensing electrodes is continuous. As shown in FIG. 7H, a second passivation layer 225 is formed on the transparent conductive layer 224. The second passivation layer 225 is etched to form a second through hole 226, through which a part of the transparent conductive layer 224 is exposed.

Figure 7I:
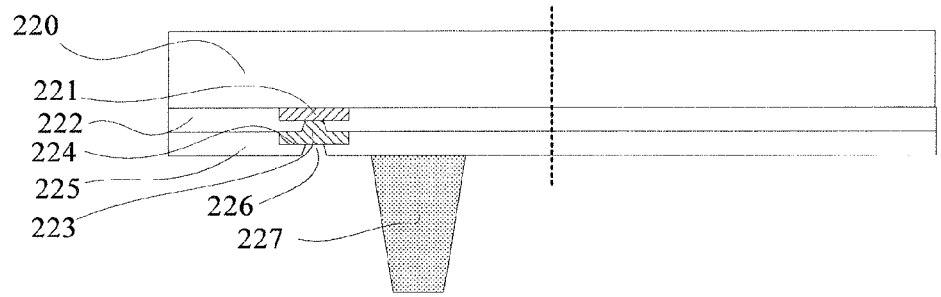
Figure 7J:
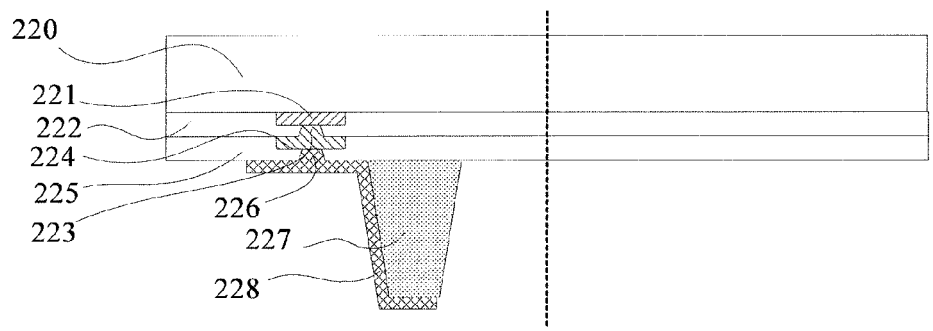
Figure 7K:
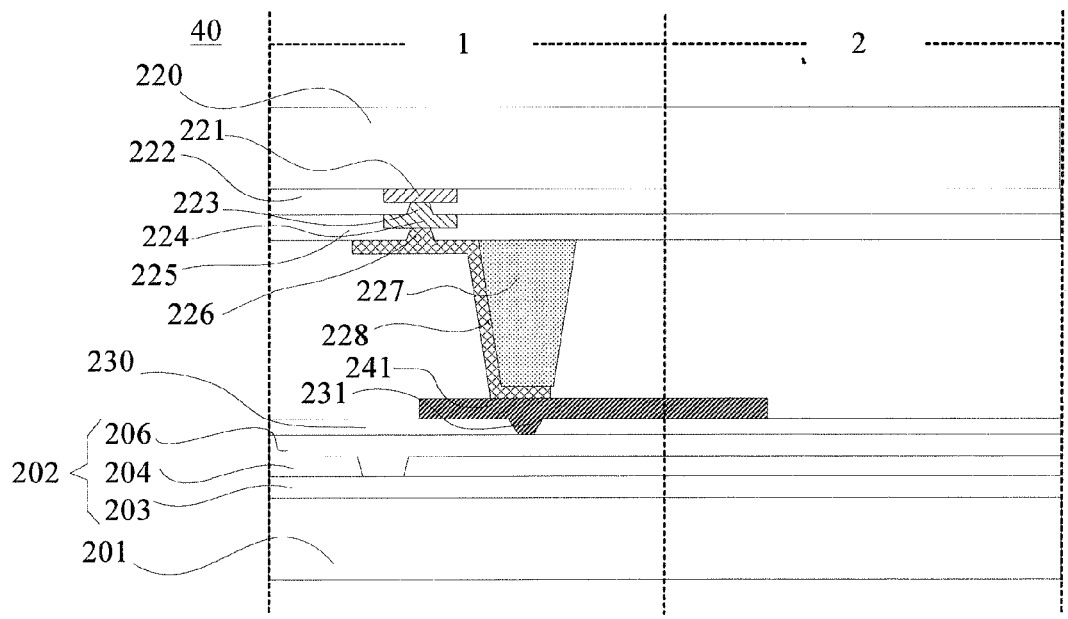

As shown in FIG. 7I, a spacer 227 is formed on the second passivation layer 225. As shown in FIG. 7J, a second conductive layer 228 is formed on the spacer 227 by sputtering. The second conductive layer 228 may be a metal layer made of Mo or may be a composite metal layer. One part of the second conductive layer 228 is formed on the spacer 227, and another part of the second conductive layer 228 is formed on the second passivation layer 225 and is in contact with the transparent conductive layer 224 via the second through hole 226. As shown in FIG. 7K, the second conductive layer 228 is further in contact with the pixel electrode layer 241. The metal layer 228 and the pixel electrode layer 241 together form a touch signal transmission unit. It should be noted that the pixel electrode layer in a periphery region is disconnected with and insulated from a pixel electrode in the display region; hence, the pixel electrode in the display region may not be influenced when the touch signal is transmitted in the pixel electrode layer in the periphery region.

FIG. 8A to FIG. 8K illustrate a flow of a method for manufacturing a touch display device 50 according to an embodiment of the disclosure.

Figure 8A:
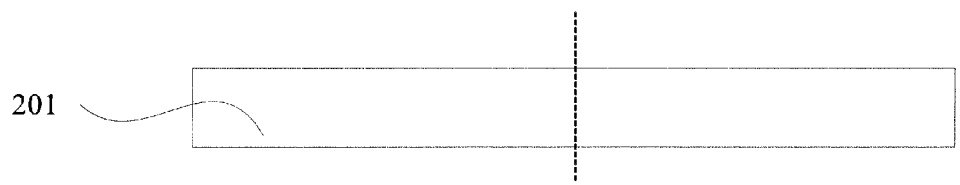
FIG. 8A to FIG. 8K illustrate cross-sectional views of intermediate stages of a method for manufacturing a touch display device according to an embodiment of the disclosure.
Figure 8B:
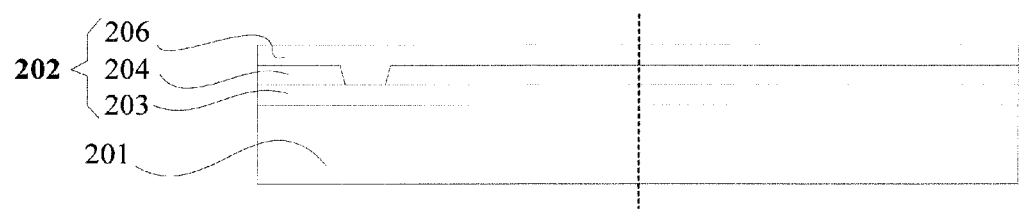

As shown in FIG. 8A, a first substrate 201 is provided. As shown in FIG. 8B, a thin film transistor element layer 202 is formed on the first substrate 201. The thin film transistor element layer 202 includes multiple TFT switches. The TFT switches include a gate layer 203, a gate insulating layer 204, a semiconductor layer 205, and a source and drain layer 206 which are successively formed on the first substrate 201 in the order listed above.

Figure 8C:
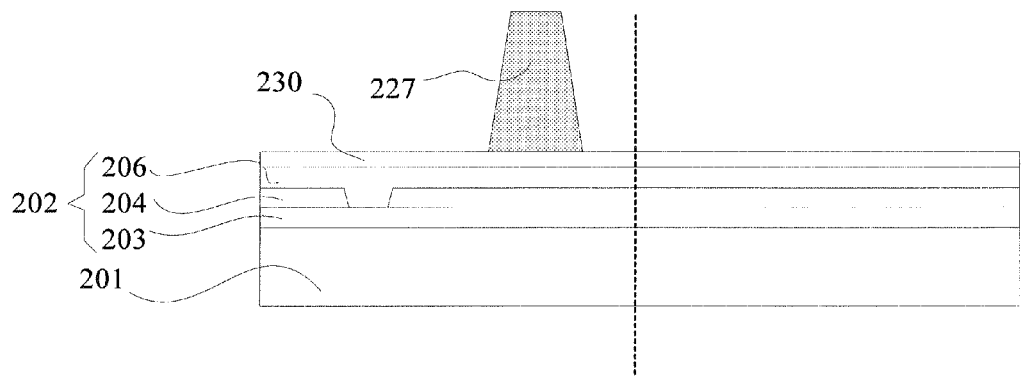
Figure 8D:
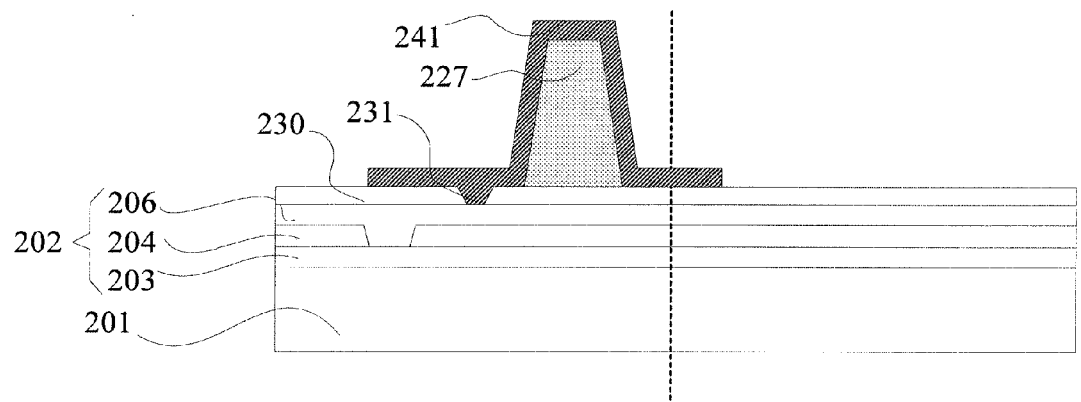

As shown in FIG. 8C, a passivation layer 230 is formed on the thin film transistor element layer 202. The passivation layer 230 is etched to form a through hole 231, through which a part of the source and drain layer 206 is exposed. A spacer 227 is formed on the passivation layer 230. As shown in FIG. 8D, a first conductive layer 241 is formed on the spacer 227. The first conductive layer 241 is a pixel electrode layer. The pixel electrode layer 241 is electrically connected to the thin film transistor element layer 202 via the through hole 231, and then the pixel electrode layer 241 is etched.

Figure 8E:
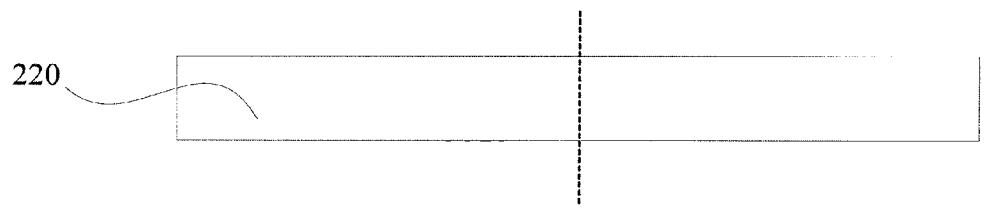
Figure 8F:
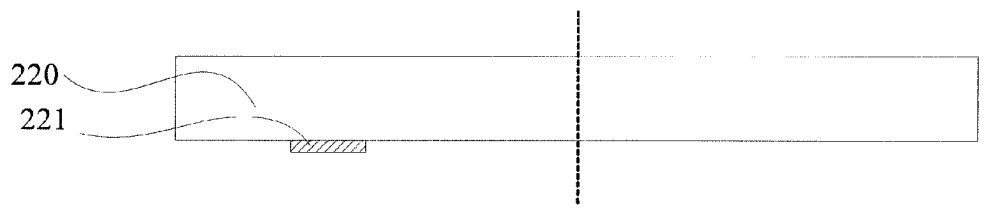
Figure 8G:
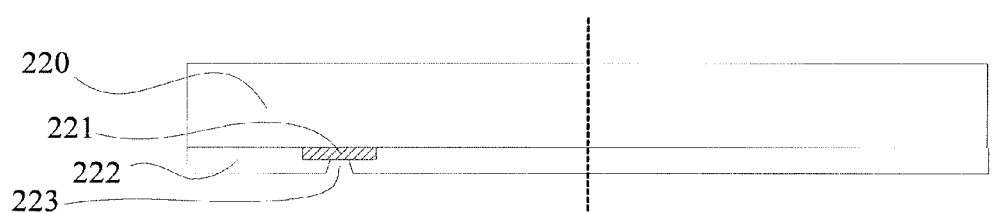
Figure 8H:
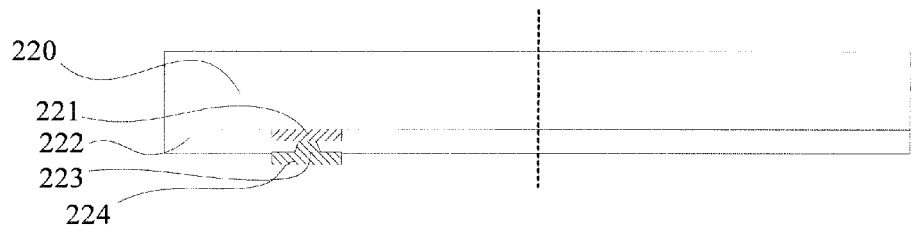
Figure 8I:
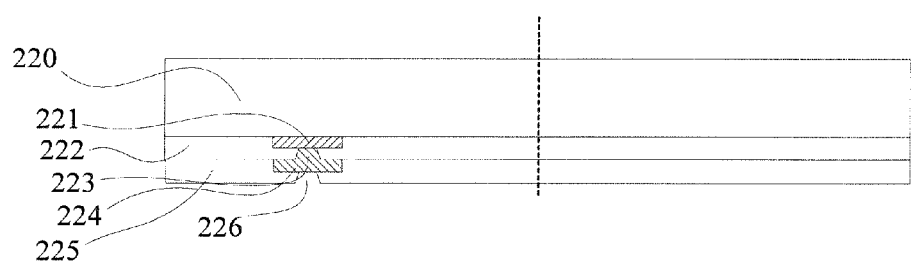

As shown in FIG. 8E, a second substrate 220 is provided. As shown in FIG. 8F, a first metal layer 221 is formed on the second substrate 220, and then the first metal layer is etched to form a conductive bridge 221. As shown in FIG. 8G, a first passivation layer 222 is formed on the conductive bridge 221, and then the first passivation layer 222 is etched to form a first through hole 223, through which a part of the conductive bridge 221 is exposed. As shown in FIG. 8H, a transparent conductive layer 224 is formed on the first passivation layer 222. The transparent conductive layer 224 is in contact with the metal bridge 221 via the first through hole 223. The transparent conductive layer 224 is etched to form, in a display region, multiple sensing electrodes $R_x$ and multiple driving segment electrodes Tx separated by the multiple sensing electrodes $R_x$. Each of the sensing electrodes is continuous. As shown in FIG. 8I, a second passivation layer 225 is formed on the transparent conductive layer 224. The second passivation layer 225 is etched to form a second through hole 226, through which a part of the transparent conductive layer 224 is exposed.

Figure 8J:
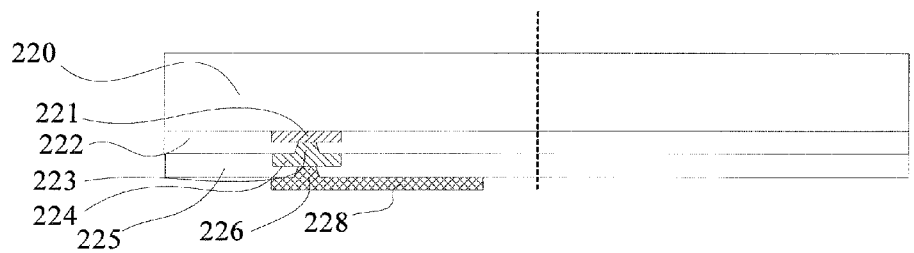
Figure 8K:
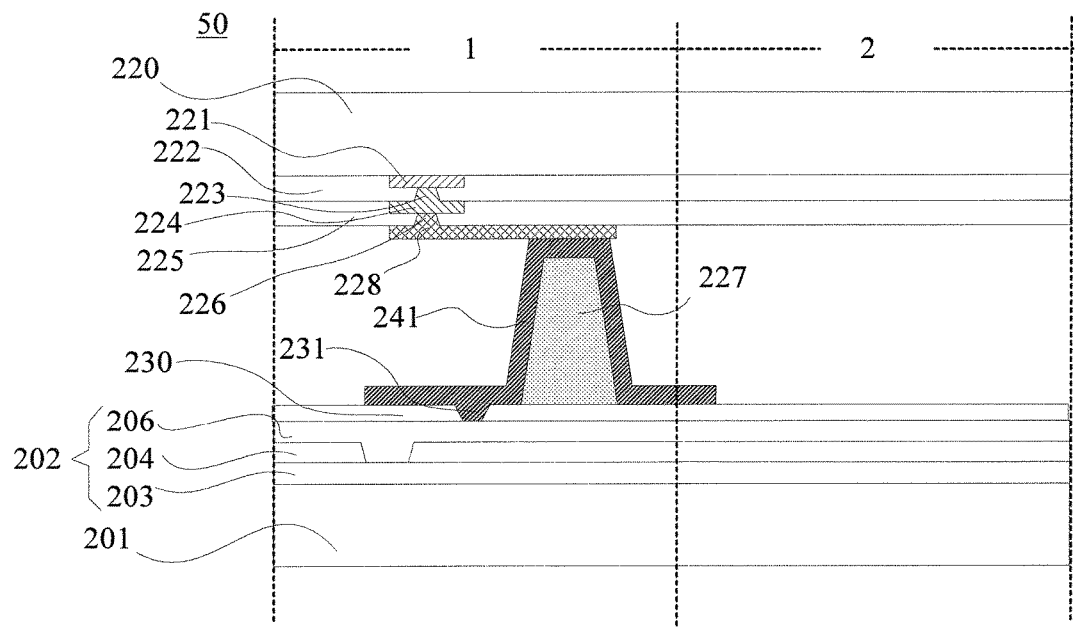

As shown in FIG. 8J, a second conductive layer 228 is formed on the second passivation layer 225. The second conductive layer 228 may be a metal layer made of Mo or may be a composite metal layer. The second conductive layer 228 is formed on the second passivation layer 225 and is in contact with the transparent conductive layer 224 via the second through hole 226. As shown in FIG. 8K, the second conductive layer 228 is further in contact with the pixel electrode layer 241. The metal layer 228 and the pixel electrode layer 241 together form a touch signal transmission unit. It should be noted that the pixel electrode layer in a periphery region is disconnected with and insulated from a pixel electrode in the display region; hence, the pixel electrode in the display region may not be influenced when the touch signal is transmitted in the pixel electrode layer in the periphery region.

In summary, the touch display devices and the methods for manufacturing the same are provided in the disclosure. The touch display devices adopt specific structures with which signal transmissions between upper substrates and lower substrates in the touch display devices may be achieved. As compared with conventional touch display devices, simplified fabrication process, improved yield, narrowed borders of the display and reduced thickness of the display may be achieved in the touch display devices provided in the disclosure.

The touch display devices and the methods for manufacturing the same according to embodiments of the disclosure are described in detail. Specific examples are used herein to set forth the principle and embodiments of the disclosure, and the above-mentioned descriptions of the embodiments merely assist in understanding the disclosure. Furthermore, it should be noted that various changes to the embodiments and application ranges of the disclosure may be made by those skilled in the art based on the concepts of the disclosure. In summary, the scope of the present invention should, therefore, be determined not with reference to the above-described embodiments, but instead should be determined with reference to the appended claims along with their equivalents.

What is claimed is:

1. A touch display device, comprising:
   a first substrate;
   a second substrate disposed opposite to the first substrate; and
   at least one touch signal transmission unit disposed at a periphery region of the touch display device, the at least one touch signal transmission unit comprising:
   a first conductive layer located above a side of the first substrate facing the second substrate;
   a second conductive layer located above a side of the second substrate facing the first substrate;
   a touch signal transmission layer located between the second conductive layer and the second substrate and electrically connected to the first conductive layer via the second conductive layer; and
   a spacer located between the first substrate and the second substrate, a vertical projection of the spacer onto the first substrate at least partially overlapping respective vertical projections of the first conductive layer and the second conductive layer onto the first substrate,
   wherein the spacer is disposed in the at least one touch signal transmission unit, and the first conductive layer is in contact with the second conductive layer without a touch occurring in a display region of the touch display device.

2. The touch display device according to claim 1, wherein the spacer is disposed above the first substrate and located between the first substrate and the first conductive layer.

3. The touch display device according to claim 1, further comprising a thin film transistor element layer on the first substrate, wherein the thin film transistor element layer comprises a plurality of thin film transistor switches.

4. The touch display device according to claim 3, further comprising an organic light-emitting pixel layer disposed on the thin film transistor element layer,
   wherein the organic light-emitting pixel layer comprises a first electrode layer and a pixel defining layer on the first electrode layer, and
   the first conductive layer is also a second electrode layer of the organic light-emitting pixel layer and is disposed on the pixel defining layer.

5. The touch display device according to claim 4, wherein the touch signal transmission unit is located in a transmission contact region and a transmission periphery region, at least one separation pattern is disposed in the transmission periphery region, and the transmission contact region is surrounded by the at least one separation pattern.

6. The touch display device according to claim 5, wherein the at least one separation pattern comprises at least two separation patterns in a nested relationship to each other, each of the at least two separation patterns being enclosed and the at least two separation patterns are rectangular, circular or polygonal.

7. The touch display device according to claim 4, wherein the spacer is disposed between the pixel defining layer and the first conductive layer.

8. The touch display device according to claim 1, further comprising a thin film transistor element layer on the first substrate,
   wherein the thin film transistor element layer comprises a plurality of thin film transistor switches, the first conductive layer is disposed on the thin film transistor element layer, and the first conductive layer is also a pixel electrode layer of the touch display device.

* * * * *